(12) United States Patent
Kaur et al.

(10) Patent No.: US 12,282,254 B2
(45) Date of Patent: Apr. 22, 2025

(54) PHOTORESIST COMPOSITIONS AND PATTERN FORMATION METHODS

(71) Applicant: ROHM AND HAAS ELECTRONIC MATERIALS LLC, Marlborough, MA (US)

(72) Inventors: Irvinder Kaur, Northborough, MA (US); Charlotte Cutler, Hopkinton, MA (US); Ke Yang, Cupertino, CA (US); Mingqi Li, Shrewsbury, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 0 days.

(21) Appl. No.: 17/491,001

(22) Filed: Sep. 30, 2021

(65) Prior Publication Data

US 2023/0161257 A1    May 25, 2023

(51) Int. Cl.
  *G03F 7/039* (2006.01)
  *G03F 7/004* (2006.01)
  *G03F 7/20* (2006.01)
  *G03F 7/32* (2006.01)

(52) U.S. Cl.
  CPC .......... *G03F 7/0397* (2013.01); *G03F 7/0045* (2013.01); *G03F 7/2004* (2013.01); *G03F 7/327* (2013.01)

(58) Field of Classification Search
  CPC .... G03F 7/0397; G03F 7/0045; G03F 7/2004; G03F 7/327
  See application file for complete search history.

(56) References Cited

U.S. PATENT DOCUMENTS

| | | | |
|---|---|---|---|
| 4,189,323 A | 2/1980 | Buhr | |
| 6,242,153 B1 * | 6/2001 | Sato | G03F 7/039 430/905 |
| 6,323,360 B1 * | 11/2001 | Ruckenstein | C08F 297/023 524/561 |
| 6,841,627 B2 | 1/2005 | Brandenburg | |
| 8,431,325 B2 | 4/2013 | Hashimoto et al. | |
| 8,741,538 B2 | 6/2014 | Ogata et al. | |
| 2004/0181023 A1 * | 9/2004 | Yamagishi | C07C 323/12 568/18 |
| 2007/0224520 A1 * | 9/2007 | Ogata | G03F 7/0397 528/401 |
| 2008/0076062 A1 * | 3/2008 | Makino | G03F 7/0392 430/327 |
| 2011/0144295 A1 * | 6/2011 | Momose | C08F 220/1808 526/323.2 |
| 2012/0118832 A1 | 5/2012 | Yontz et al. | |
| 2013/0261254 A1 | 10/2013 | Mullen et al. | |
| 2014/0343222 A1 | 11/2014 | Yontz et al. | |
| 2016/0254142 A1 * | 9/2016 | Chang | G03F 7/168 438/694 |
| 2020/0341367 A1 | 10/2020 | Kuri et al. | |
| 2020/0393762 A1 | 12/2020 | Ogawa et al. | |
| 2021/0011380 A1 | 1/2021 | Nihashi et al. | |
| 2023/0104679 A1 | 4/2023 | Kaur et al. | |

FOREIGN PATENT DOCUMENTS

| | | | | |
|---|---|---|---|---|
| CN | 110655813 A | * | 1/2020 | |
| CN | 111944462 A | * | 11/2020 | ............ C08F 130/02 |
| JP | 2003107709 A | | 4/2003 | |
| JP | 2003131382 A | | 5/2003 | |
| JP | 2003195504 A | | 7/2003 | |
| JP | 2004085900 A | | 3/2004 | |
| JP | 2005325325 A | | 11/2005 | |
| JP | 2009241418 A | * | 10/2009 | |
| JP | 2010248292 A | | 11/2010 | |
| JP | 2013205837 A | | 10/2013 | |
| JP | 2015052769 A | | 3/2015 | |
| JP | 2018189759 A | | 11/2018 | |
| JP | 2019085554 A | | 6/2019 | |
| JP | 2020046668 A | | 3/2020 | |

* cited by examiner

*Primary Examiner* — Sean M DeGuire
*Assistant Examiner* — Alexander N. Lee
(74) *Attorney, Agent, or Firm* — CANTOR COLBURN LLP

(57) ABSTRACT

A polymer, comprising a first repeating unit derived from a first monomer comprising a single ester acetal group, and a second repeating unit derived from a second monomer comprising a plurality of ester acetal groups.

17 Claims, No Drawings

PHOTORESIST COMPOSITIONS AND PATTERN FORMATION METHODS

FIELD

The present invention relates to photoresist compositions and to pattern formation methods using such photoresist compositions. The invention finds particular applicability in lithographic applications in the semiconductor manufacturing industry.

BACKGROUND

Photoresist materials are photosensitive compositions typically used for transferring an image to one or more underlying layers such as a metal, semiconductor, or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

State-of-the-art lithographic patterning processes currently employ ArF (193 nm) immersion scanners to process wafers at dimensions that are less than 60 nanometers (nm). Pushing ArF lithography to sub-60 nm critical dimensions creates several challenges for the photoresist capabilities in terms of process window, line width roughness (LWR), and other critical parameters for high volume manufacturing of integrated circuits. All of these parameters must be addressed in next-generation formulations. As pattern dimensions are reduced in advanced nodes, LWR values have not been concurrently reduced at the same rate, creating a significant source of variation during processing at those leading-edge nodes. Process window improvements are also useful for achieving high yield in integrated circuit manufacturing.

Extreme ultraviolet lithography (EUV lithography) is another leading technology for high volume semiconductor wafer manufacturing at sub-20 nm critical dimensions.

There remains a continued need for photoresist compositions to address one or more problems associated with photolithographic patterning at sub-60 nm critical dimensions. In particular, there is a continuing need for photoresist compositions that can achieve improved resolution and reduced LWR.

SUMMARY

Provided is a polymer that comprises a first repeating unit derived from a first monomer comprising a single ester acetal group, and a second repeating unit derived from a second monomer comprising a plurality of ester acetal groups.

Also provided is a photoresist composition comprising the polymer, a photoacid generator, and a solvent.

Further provided is a method of forming a pattern comprising applying a layer of the photoresist composition on a substrate to provide a photoresist composition layer, patternwise exposing the photoresist composition layer to activating radiation to provide an exposed photoresist composition layer; and developing the exposed photoresist composition layer to provide a photoresist pattern.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "actinic rays" or "radiation" means, for example, a bright line spectrum of a mercury lamp, far ultraviolet rays represented by an excimer laser, extreme ultraviolet rays (EUV light), X-rays, particle rays such as electron beams and ion beams, or the like. In addition, in the present invention, "light" means actinic rays or radiation.

The argon fluoride laser (ArF laser) is a particular type of excimer laser, which is sometimes referred to as an exciplex laser. "Excimer" is short for "excited dimer," while "exciplex" is short for "excited complex." An excimer laser uses a mixture of a noble gas (argon, krypton, or xenon) and a halogen gas (fluorine or chlorine), which under suitable conditions of electrical stimulation and high pressure, emits coherent stimulated radiation (laser light) in the ultraviolet range.

Furthermore, "exposure" in the present specification includes, unless otherwise specified, not only exposure by a mercury lamp, far ultraviolet rays represented by an excimer laser, X-rays, extreme ultraviolet rays (EUV light), or the like, but also writing by particle rays such as electron beams and ion beams.

As used herein, the term "hydrocarbon" refers to an organic compound or group having at least one carbon atom and at least one hydrogen atom; "alkyl" refers to a straight or branched chain saturated hydrocarbon group having the specified number of carbon atoms and having a valence of one; "alkylene" refers to an alkyl group having a valence of two; "hydroxyalkyl" refers to an alkyl group substituted with at least one hydroxyl group (—OH); "alkoxy" refers to "alkyl-O—"; "carboxyl" and "carboxylic acid group" refer to a group having the formula "—C(=O)—OH"; "cycloalkyl" refers to a monovalent group having one or more saturated rings in which all ring members are carbon; "cycloalkylene" refers to a cycloalkyl group having a valence of two; "alkenyl" refers to a straight or branched chain, monovalent hydrocarbon group having at least one carbon-carbon double bond; "alkenoxy" refers to "alkenyl-O—"; "alkenylene" refers to an alkenyl group having a valence of two; "cycloalkenyl" refers to a non-aromatic cyclic divalent hydrocarbon group having at least three carbon atoms, with at least one carbon-carbon double bond; "alkynyl" refers to a monovalent hydrocarbon group having at least one carbon-carbon triple bond; the term "aromatic group" refers to a monocyclic or polycyclic ring system that satisfies the Huckel Rule and includes carbon atoms in the ring, and optionally may include one or more heteroatoms selected from N, O, and S instead of a carbon atom in the ring; "aryl" refers to a monovalent aromatic monocyclic or polycyclic ring system where every ring member is carbon, and may include a group with an aromatic ring fused to at least one cycloalkyl or heterocycloalkyl ring; "arylene" refers to an aryl group having a valence of two; "alkylaryl" refers to an aryl group that has been substituted with an alkyl group; "arylalkyl" refers to an alkyl group that has been substituted with an aryl group; "aryloxy" refers to "aryl-O—"; and "arylthio" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, or P; "heteroatom-containing group" refers to a substituent group that includes at least one heteroatom; "heteroalkyl" refers to an alkyl group having at least one heteroatom instead of carbon; "heterocycloalkyl" refers to a cycloalkyl group having at least one heteroatom as ring member instead of carbon; "heterocycloalkylene" refers to a heterocycloalkyl group having a valence of two.

The term "heteroaryl" means an aromatic 4-8 membered monocyclic, 8-12 membered bicyclic, or 11-14 membered tricyclic ring systems having 1-4 heteroatoms (if monocyclic), 1-6 heteroatoms (if bicyclic), or 1-9 heteroatoms (if tricyclic) that are each independently selected from N, O, S, Si, or P (e.g., carbon atoms and 1-3, 1-6, or 1-9 heteroatoms of N, O, or S, if monocyclic, bicyclic, or tricyclic, respectively). Examples of heteroaryl groups include pyridyl, furyl (furyl or furanyl), imidazolyl, benzimidazolyl, pyrimidinyl, thiophenyl or thienyl, quinolinyl, indolyl, thiazolyl, and the like.

The term "halogen" means a monovalent substituent that is fluorine (fluoro), chlorine (chloro), bromine (bromo), or iodine (iodo). The prefix "halo" means a group including one or more of a fluoro, chloro, bromo, or iodo substituent instead of a hydrogen atom. A combination of halo groups (e.g., bromo and fluoro), or only fluoro groups may be present. For example, the term "haloalkyl" refers to an alkyl group substituted with one or more halogens. As used herein, "substituted $C_{1-8}$ haloalkyl" refers to a $C_{1-8}$ alkyl group substituted with at least one halogen, and is further substituted with one or more other substituent groups that are not halogens. It is to be understood that substitution of a group with a halogen atom is not to be considered a heteroatom-containing group, because a halogen atom does not replace a carbon atom.

"Fluorinated" shall be understood to mean having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$). A "substituted fluoroalkyl group" shall be understood to mean a fluoroalkyl group that is further substituted by an additional substituent group.

Each of the foregoing substituent groups optionally may be substituted unless expressly provided otherwise. The term "optionally substituted" refers to being substituted or unsubstituted. "Substituted" means that at least one hydrogen atom of the chemical structure is replaced with another terminal substituent group that is typically monovalent, provided that the designated atom's normal valence is not exceeded. When the substituent is oxo (i.e., =O), then two geminal hydrogen atoms on the carbon atom are replaced with the terminal oxo group. Combinations of substituents or variables are permissible. Exemplary substituent groups that may be present on a "substituted" position include, but are not limited to, nitro (—$NO_2$), cyano (—CN), hydroxyl (—OH), oxo (=O), amino (—$NH_2$), mono- or di-($C_{1-6}$) alkylamino, alkanoyl (such as a $C_{2-6}$ alkanoyl group such as acyl), formyl (—C(=O)H), carboxylic acid or an alkali metal or ammonium salt thereof, esters (including acrylates, methacrylates, and lactones) such as $C_{2-6}$ alkyl esters (—C(=O)O-alkyl or —OC(=O)-alkyl) and $C_{7-13}$ aryl esters (—C(=O)O-aryl or —OC(=O)-aryl); amido (—C(=O)$NR_2$ wherein R is hydrogen or $C_{1-6}$ alkyl), carboxamido (—$CH_2$C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{3-18}$ heterocycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{3-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$—). When a group is substituted, the indicated number of carbon atoms is the total number of carbon atoms in the group, excluding those of any substituents. For example, the group —$CH_2CH_2CN$ is a cyano-substituted $C_2$ alkyl group.

As used herein, an "acid-labile group" refers to a group in which a bond is cleaved by the catalytic action of an acid, optionally and typically with thermal treatment, resulting in formation of a polar group, such as a carboxylic acid or alcohol group, being formed on the polymer, and optionally and typically with a moiety connected to the cleaved bond becoming disconnected from the polymer. In other systems, a non-polymeric compound may include an acid-labile group that may be cleaved by the catalytic action of an acid, resulting in formation of a polar group, such as a carboxylic acid or alcohol group on a cleaved portion of the non-polymeric compound. Such acid is typically a photo-generated acid with bond cleavage occurring during post-exposure baking; however, embodiments are not limited thereto, and, for example, such acid may be thermally generated. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

As used herein, when a definition is not otherwise provided, a "divalent linking group" refers to a divalent group including one or more of —O—, —S—, —Te—, —Se—, —C(O)—, —N($R^a$)—, —S(O)—, —S(O)$_2$—, —C(S)—, —C(Te)—, —C(Se)—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein $R^a$ is hydrogen, substituted or unsubstituted $C_{1-20}$ alkyl, substituted or unsubstituted $C_{1-20}$ heteroalkyl, substituted or unsubstituted $C_{6-30}$ aryl, or substituted or unsubstituted $C_{3-30}$ heteroaryl. Typically, the divalent linking group includes one or more of —O—, —S—, —C(O)—, —N($R^a$)—, —S(O)—, —S(O)$_2$—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein $R^a$ is hydrogen, substituted or unsubstituted $C_{1-20}$ alkyl, substituted or unsubstituted $C_{1-20}$ heteroalkyl, substituted or unsubstituted $C_{6-30}$ aryl, or substituted or unsubstituted $C_{3-30}$ heteroaryl. More typically, the divalent linking group includes at least one of —O—, —C(O)—, —C(O)O—, —N($R^a$)—, —C(O)N($R^a$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein $R^a$ is hydrogen, substituted or unsubstituted $C_{1-10}$ alkyl, substituted or unsubstituted $C_{1-10}$ heteroalkyl, substituted or unsubstituted $C_{6-10}$ aryl, or substituted or unsubstituted $C_{3-10}$ heteroaryl.

The present invention relates to a polymer for a photoresist composition. The polymer includes a first repeating unit derived from a first monomer comprising a single ester acetal group, and a second repeating unit derived from a second monomer comprising a plurality of ester acetal groups. As used herein, the term "a single ester acetal group" means the first monomer includes one ester acetal group. In other words, the first monomer has one ester acetal group and not more than one ester acetal groups. In contrast, the "plurality of ester acetal groups" of the second monomer refers to the 2 or more ester acetal groups that are included in the second monomer. For example, the second monomer may include 2, 3, 4, 5, or 6 ester acetal groups, typically 2, 3, or 4 ester acetal group. In some embodiments, the second monomer includes 2 ester acetal groups.

The present inventors have discovered that the polymers of the invention can be used to prepare photoresist compositions. The photoresist compositions of the invention can be used to prepare photoresist films that have improved lithographic properties, for example, improved line width roughness (LWR), exposure latitude, pattern collapse, photospeed, or a combination thereof.

The polymer includes a first repeating unit derived from a first monomer comprising a single ester acetal group, and a second repeating unit derived from a second monomer comprising a plurality of ester acetal groups. In some embodiments, the first monomer and the second monomer each comprises a carbon-carbon unsaturated vinylic group. As used herein, a "carbon-carbon unsaturated vinyl group" refers to a vinyl-containing polymerizable group, and typically may be selected from substituted or unsubstituted $C_{2-20}$ alkenyl, substituted or unsubstituted norbornyl, substituted or unsubstituted (meth)acrylic, substituted or unsubstituted vinyl ether, substituted or unsubstituted vinyl ketone, substituted or unsubstituted vinyl ester, or substituted or unsubstituted vinyl aromatic, and preferably selected from a substituted or unsubstituted norbornyl group, a substituted or unsubstituted (meth)acrylic group, or a substituted or unsubstituted vinyl aromatic group.

The first repeating unit of the polymer may be derived from a first monomer of Formula (1):

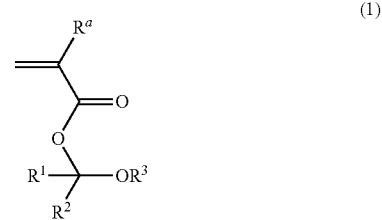

In Formula (1), $R^a$ is hydrogen, fluorine, cyano, substituted or unsubstituted $C_{1-10}$ alkyl. Preferably, $R^a$ is hydrogen, fluorine, or substituted or unsubstituted $C_{1-5}$ alkyl, typically methyl.

In Formula (1), $R^1$ and $R^2$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{3-20}$ heteroaryl, substituted or unsubstituted $C_{4-30}$ heteroarylalkyl, or substituted or unsubstituted $C_{4-30}$ alkylheteroaryl. Preferably, $R^1$ and $R^2$ are each independently hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. Each of $R^1$ and $R^2$ optionally further comprises a divalent linking group as part of their structure.

In Formula (1), $R^1$ and $R^2$ optionally together may form a ring via a single bond or a divalent linking group. The ring may be monocyclic, non-fused polycyclic, or fused polycyclic, and is typically monocyclic when formed.

In Formula (1), $R^3$ is substituted or unsubstituted $C_{1-20}$ alkyl, substituted or unsubstituted $C_{3-20}$ cycloalkyl, or substituted or unsubstituted $C_{3-20}$ heterocycloalkyl. $R^3$ optionally further comprises a divalent linking group as part of its structure.

In Formula (1), one of $R^1$ or $R^2$ optionally may form a heterocyclic ring together with $R^3$ via a single bond or a divalent linking group, wherein the ring is substituted or unsubstituted. The ring may be monocyclic, non-fused polycyclic, or fused polycyclic, and is typically monocyclic when formed.

In some aspects, the first monomers may have Formula (2):

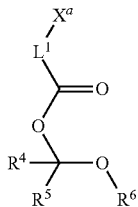
(2)

In Formula (2), $X^a$ is a polymerizable group that may be a carbon-carbon unsaturated vinylic group; L is a single bond or a divalent linking group chosen from substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-12}$ arylene, substituted or unsubstituted $C_{3-12}$ heteroarylene, or a combination thereof, $R^4$ and $R^5$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{4-20}$ heteroaryl, substituted or unsubstituted $C_{4-30}$ heteroarylalkyl, or substituted or unsubstituted $C_{4-30}$ alkylheteroaryl. Preferably, $R^4$ and $R^5$ are each independently hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. Each of $R^4$ and $R^5$ optionally further comprises a divalent linking group as part of their structure.

In Formula (2), $R^4$ and $R^5$ optionally together may form a ring via a single bond or a divalent linking group. The ring may be monocyclic, non-fused polycyclic, or fused polycyclic, and is typically monocyclic when formed.

In Formula (2), $R^6$ is substituted or unsubstituted $C_{1-20}$ alkyl, substituted or unsubstituted $C_{3-20}$ cycloalkyl, or substituted or unsubstituted $C_{3-20}$ heterocycloalkyl. $R^6$ optionally further comprises a divalent linking group as part of its structure.

In Formula (2), one of $R^4$ or $R^5$ optionally may form a heterocyclic ring together with $R^6$ via a single bond or a divalent linking group, wherein the ring is substituted or unsubstituted. The ring may be monocyclic, non-fused polycyclic, or fused polycyclic, and is typically monocyclic when formed.

In some aspects, the first monomer is selected from Formula (1), Formula (2), or a combination thereof.

Exemplary first monomers from which the first repeating unit of the polymer may be derived include:

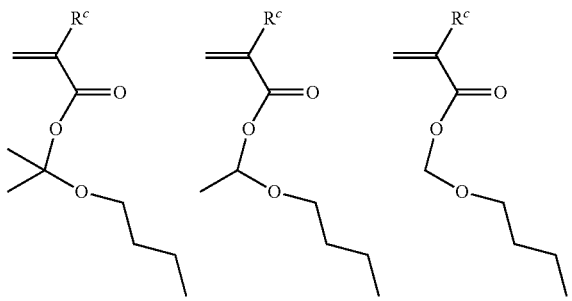

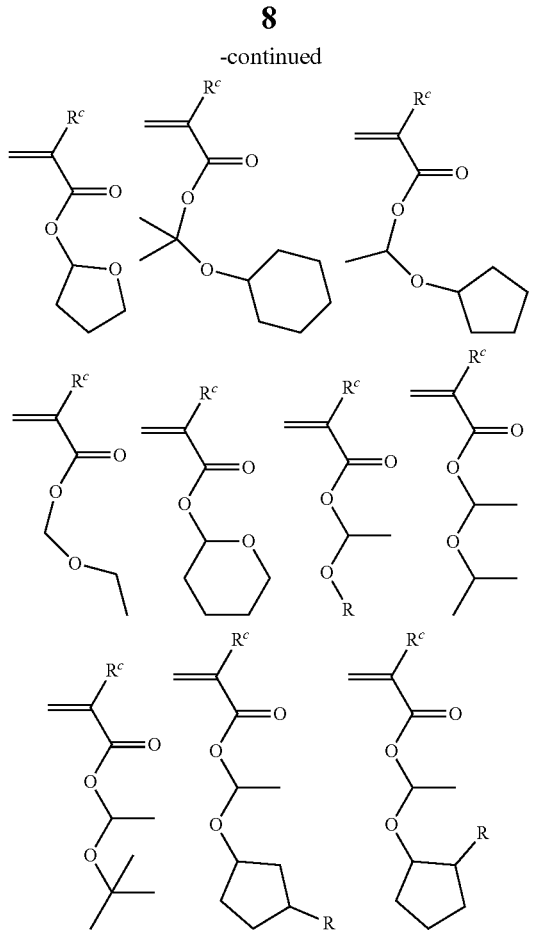

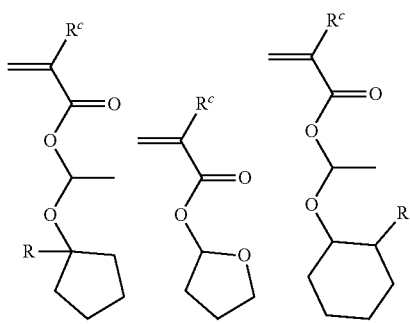

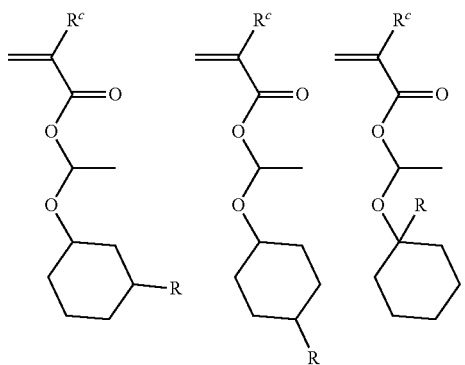

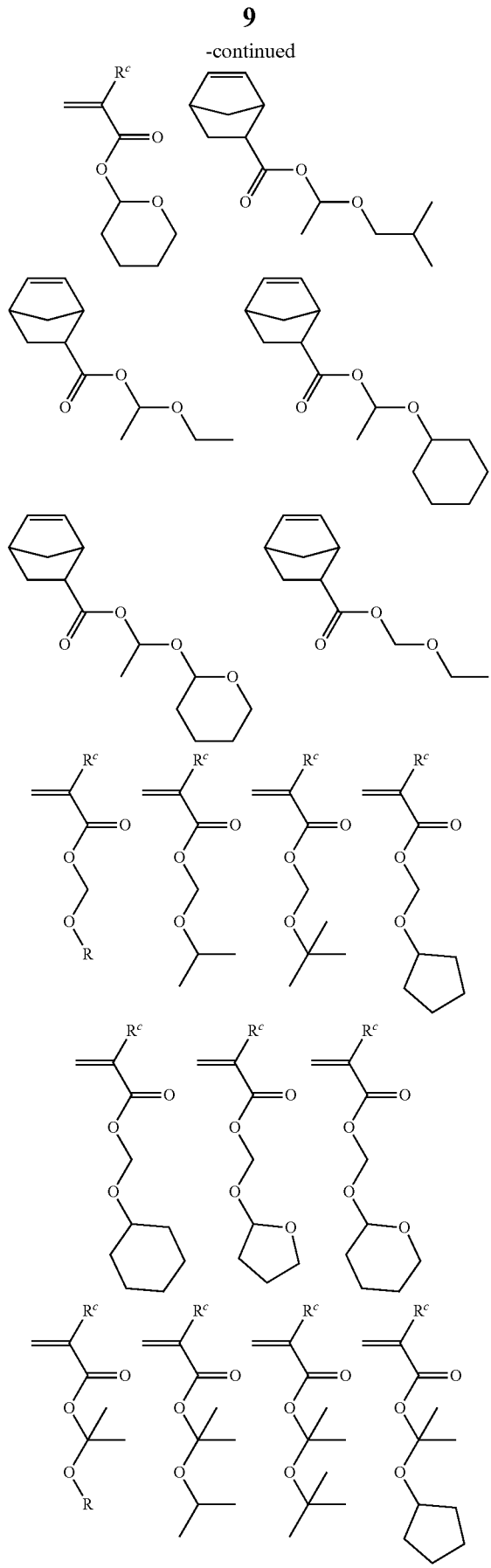

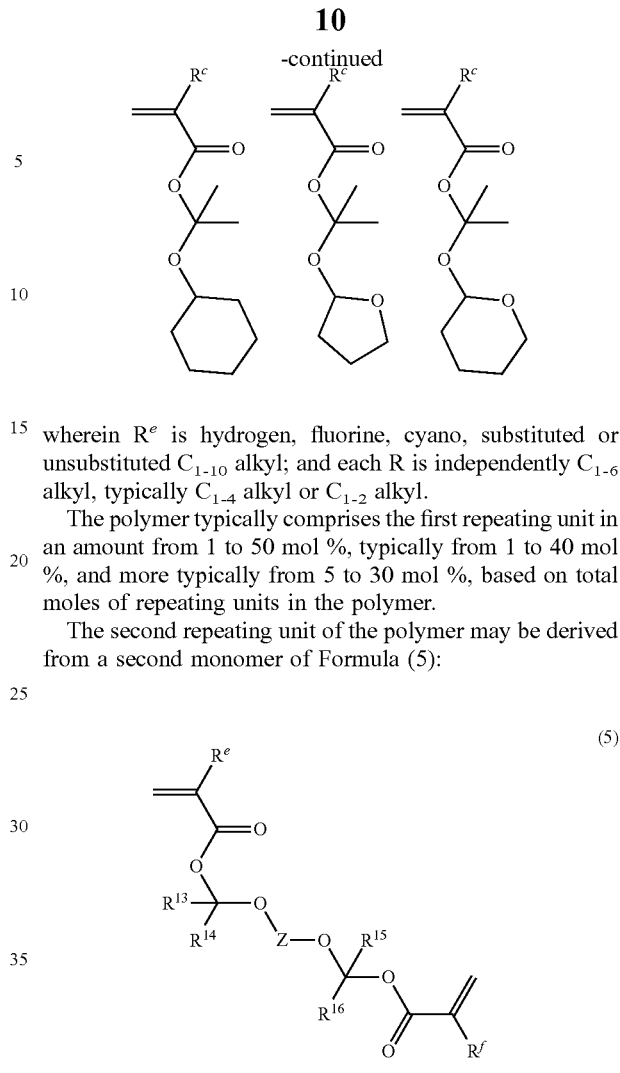

wherein $R^e$ is hydrogen, fluorine, cyano, substituted or unsubstituted $C_{1-10}$ alkyl; and each R is independently $C_{1-6}$ alkyl, typically $C_{1-4}$ alkyl or $C_{1-2}$ alkyl.

The polymer typically comprises the first repeating unit in an amount from 1 to 50 mol %, typically from 1 to 40 mol %, and more typically from 5 to 30 mol %, based on total moles of repeating units in the polymer.

The second repeating unit of the polymer may be derived from a second monomer of Formula (5):

(5)

In Formula (5), $R^e$ and $R^f$ are each independently hydrogen, fluorine, cyano, substituted or unsubstituted $C_{1-10}$ alkyl. Preferably, $R^e$ and $R^f$ are each independently hydrogen, fluorine, or substituted or unsubstituted $C_{1-5}$ alkyl, typically methyl.

In Formula (5), $R^{13}$, $R^{14}$, $R^{15}$ and $R^{16}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{3-20}$ heteroaryl, substituted or unsubstituted $C_{4-30}$ heteroarylalkyl, or substituted or unsubstituted $C_{4-30}$ alkylheteroaryl. Preferably, $R^{13}$, $R^{14}$, $R^{15}$, and $R^{16}$ are each independently hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. Each of $R^{13}$, $R^{14}$, $R^{15}$, and $R^{16}$ optionally further comprises a divalent linking group as part of their structure.

In Formula (5), $R^{13}$ and $R^{14}$ optionally together may form a ring via a single bond or a divalent linking group. The ring may be monocyclic, non-fused polycyclic, or fused polycyclic, and is typically monocyclic when formed.

In Formula (5), $R^{15}$ and $R^{16}$ optionally together may form a ring via a single bond or a divalent linking group. The ring may be monocyclic, non-fused polycyclic, or fused polycyclic, and is typically monocyclic when formed.

In Formula (5), Z is a divalent linking group. Preferably, Z is substituted or unsubstituted $C_{1-8}$ alkylene, substituted or unsubstituted $C_{3-8}$ cycloalkylene, substituted or unsubstituted $C_{3-8}$ heterocycloalkylene, substituted or unsubstituted $C_{6-12}$ arylene, or substituted or unsubstituted $C_{3-12}$ heteroarylene.

Exemplary second monomers from which the second repeating unit of the polymer may be derived include:

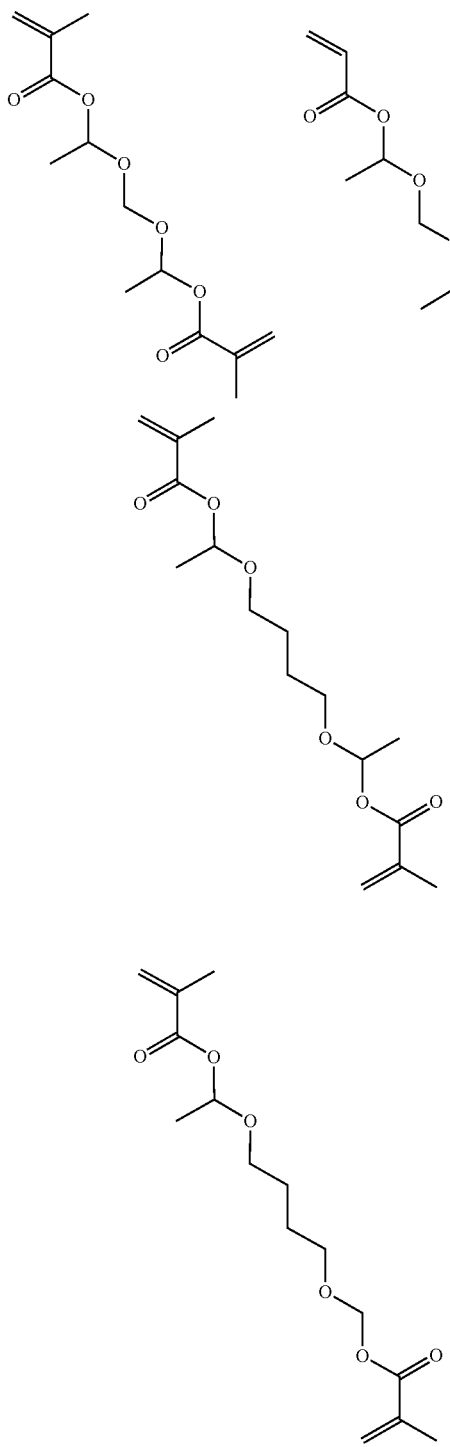

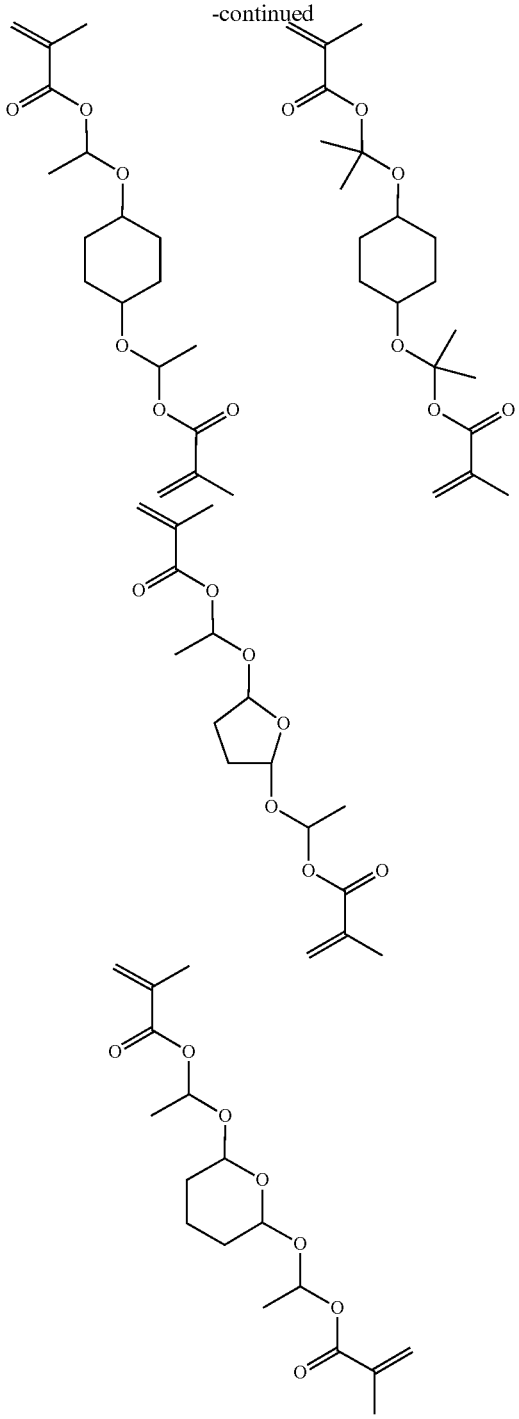

The polymer typically comprises the second repeating unit in an amount from 1 to 50 mol %, typically from 1 to 40 mol %, and more typically from 5 to 30 mol %, based on total moles of repeating units in the polymer.

The polymer may further optionally include one or more additional repeating units. The additional repeating units may be, for example, one or more additional units for purposes of adjusting properties of the photoresist composition, such as etch rate and solubility. Exemplary additional units may include those derived from one or more of (meth)acrylate, vinyl aromatic, vinyl ether, vinyl ketone, and/or vinyl ester monomers. The one or more additional repeating units, if present in the polymer, may be used in an amount of up to 90 mol %, typically from 1 to 90 mol %, or 3 to 80 mol %, based on total repeating units of the polymer.

In some aspects, the polymer may further optionally include a repeating unit derived from an acetal monomer that does not include an ester acetal, for example a monomer of Formula (3), Formula (4), or a combination thereof:

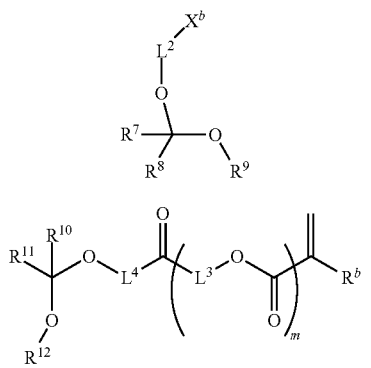

In Formula (3), $X^b$ is a polymerizable group that may be a carbon-carbon unsaturated vinylic group; $L^2$ is a divalent linking group chosen from substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-12}$ arylene, substituted or unsubstituted $C_{4-12}$ heteroarylene, or a combination thereof;

In Formula (3), $R^7$ and $R^8$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{3-20}$ heteroaryl, substituted or unsubstituted $C_{4-30}$ heteroarylalkyl, or substituted or unsubstituted $C_{4-30}$ alkylheteroaryl. Preferably, $R^7$ and $R^8$ are each independently hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. Each of $R^7$ and $R^8$ optionally further comprises a divalent linking group as part of their structure.

In Formula (3), $R^9$ is substituted or unsubstituted $C_{1-20}$ alkyl, substituted or unsubstituted $C_{3-20}$ cycloalkyl, or substituted or unsubstituted $C_{3-20}$ heterocycloalkyl. $R^9$ optionally further comprises a divalent linking group as part of its structure.

In Formula (3), one of $R^7$ or $R^8$ optionally may form a heterocyclic ring together with $R^9$ via a single bond or a divalent linking group, wherein the ring is substituted or unsubstituted. The ring may be monocyclic, non-fused polycyclic, or fused polycyclic, and is typically monocyclic when formed.

In Formula (4), $R^b$ is hydrogen, fluorine, cyano, substituted or unsubstituted $C_{1-10}$ alkyl. Preferably, $R^b$ is hydrogen, fluorine, or substituted or unsubstituted $C_{1-5}$ alkyl, typically methyl. $L^3$ is a divalent linking group chosen from substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-12}$ arylene, substituted or unsubstituted $C_{3-12}$ heteroarylene, or a combination thereof, $L^4$ is substituted or unsubstituted $C_{1-10}$ alkylene; and m is 0 or 1.

In Formula (4), $R^{10}$ and $R^{11}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{4-20}$ heteroaryl, substituted or unsubstituted $C_{4-30}$ heteroarylalkyl, or substituted or unsubstituted $C_{4-30}$ alkylheteroaryl. Preferably, $R^{10}$ and $R^{11}$ are each independently hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. Each of $R^{10}$ and $R^{11}$ optionally further comprises a divalent linking group as part of their structure.

In Formula (4), $R^{12}$ is substituted or unsubstituted $C_{1-20}$ alkyl, substituted or unsubstituted $C_{3-20}$ cycloalkyl, or substituted or unsubstituted $C_{3-20}$ heterocycloalkyl. $R^{12}$ optionally further comprises a divalent linking group as part of its structure.

In Formula (4), one of $R^{10}$ or $R^{11}$ optionally may form a heterocyclic ring together with $R^{12}$ via a single bond or a divalent linking group, wherein the ring is substituted or unsubstituted. The ring may be monocyclic, non-fused polycyclic, or fused polycyclic, and is typically monocyclic when formed.

In some aspects, the polymer may further include a repeating unit comprising an acid-labile group, which can be cleaved by photo-generated acid at post-exposure bake conditions. For example, the repeating unit comprising the acid-labile group may be a third repeating unit of the polymer. The third repeating unit may be structurally different from the first repeating and/or the second repeating unit.

Non-limiting examples of monomers represented by Formula (3) include:

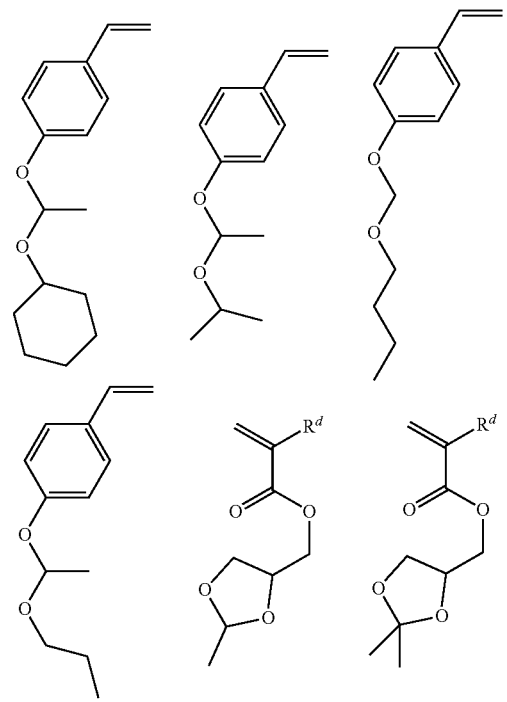

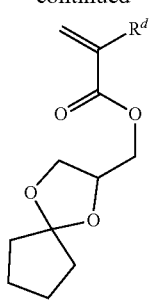

wherein $R^d$ is hydrogen, fluorine, cyano, substituted or unsubstituted $C_{1-10}$ alkyl.

Non-limiting examples of monomers represented by Formula (4) include:

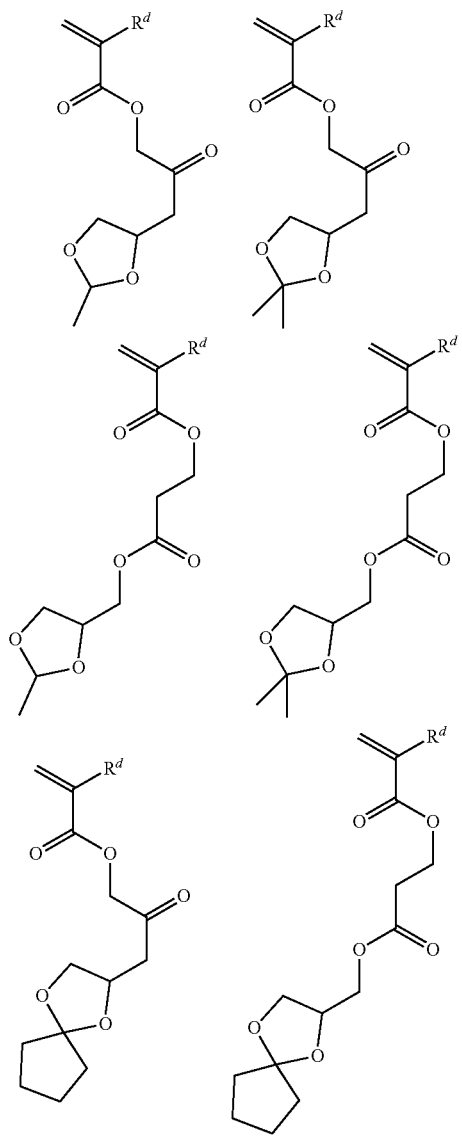

wherein $R^d$ is hydrogen, fluorine, cyano, substituted or unsubstituted $C_{1-10}$ alkyl.

Non-limiting examples of monomers having a cyclic acetal or cyclic ketal group include, for example, one or more of the following:

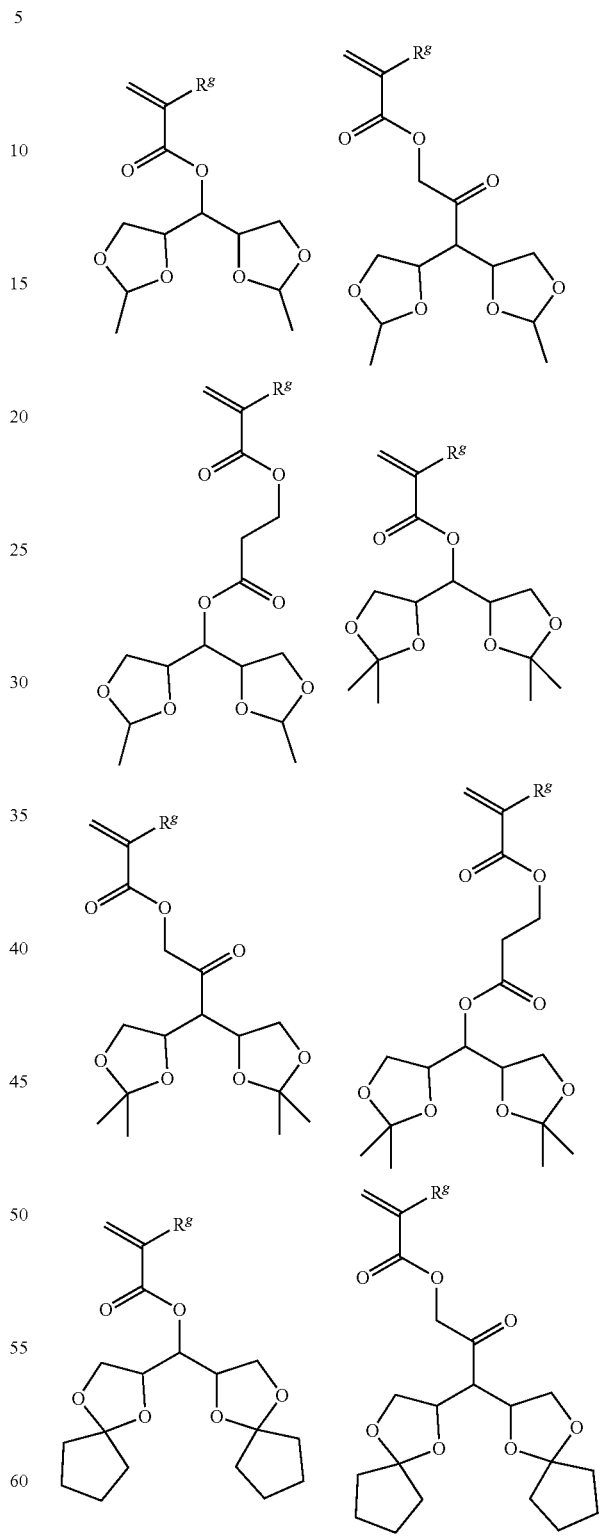

-continued

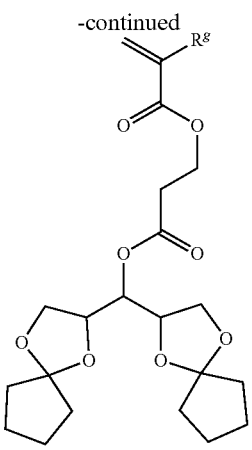

wherein $R^9$ is hydrogen, fluorine, cyano, substituted or unsubstituted $C_{1-10}$ alkyl.

In one or more embodiments, the polymer does not include a repeating unit that contains a non-ester acetal group or a ketal group. For example, in one or more embodiments, the polymer does not include a repeating unit derived from a monomer of Formula (3) or Formula (4).

The repeating unit comprising the acid-labile group may be derived from one or more monomers of Formulae (6), (7), or (8):

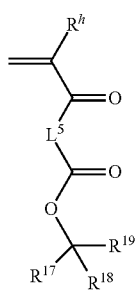
(6)

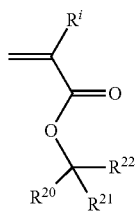
(7)

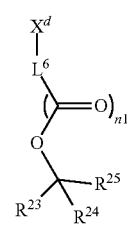
(8)

In Formulae (6) and (7), $R^h$ and $R^i$ may each independently be hydrogen, fluorine, cyano, or substituted or unsubstituted $C_{1-10}$ alkyl. Preferably, $R^h$ and $R^i$ may each independently be hydrogen, fluorine, or substituted or unsubstituted $C_{1-5}$ alkyl, typically methyl.

In Formula (6), $L^5$ is a divalent linking group. For example, $L^5$ may include 1 to 10 carbon atoms and at least one heteroatom. In a typical example, $L^5$ may be —OCH$_2$—, —OCH$_2$CH$_2$O—, or —N(R$^{6a}$)—, wherein R6$^a$ is hydrogen or $C_{1-6}$ alkyl.

In Formulae (6) and (7), $R^{17}$ to $R^{22}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{3-20}$ heteroaryl, provided that no more than one of $R^{17}$ to $R^{19}$ may be hydrogen and no more than one of $R^{20}$ to $R^{22}$ may be hydrogen, and provided that if one of $R^{17}$ to $R^{19}$ is hydrogen, then at least one of the others from $R^{17}$ to $R^{19}$ is substituted or unsubstituted $C_{6-20}$ aryl or substituted or unsubstituted $C_{3-20}$ heteroaryl, and if one of $R^{20}$ to $R^{22}$ is hydrogen, then at least one of the others from $R^{20}$ to $R^{22}$ is substituted or unsubstituted $C_{6-20}$ aryl or substituted or unsubstituted $C_{3-20}$ heteroaryl. Preferably, $R^{17}$ to $R^{22}$ are each independently substituted or unsubstituted $C_{1-6}$ alkyl or substituted or unsubstituted $C_{3-10}$ cycloalkyl. Each of $R^{17}$ to $R^{22}$ may optionally further comprise a divalent linking group as part of their structure.

In Formula (6), any two of $R^{17}$ to $R^{19}$ together optionally may form a ring, which may further include a divalent linking group as part of its structure, and wherein the ring may be substituted or unsubstituted. In Formula (7), any two of $R^{20}$ to $R^{22}$ together optionally may form a ring, which may further include a divalent linking group as part of its structure, wherein the ring group may be substituted or unsubstituted.

For example, any one or more of $R^{17}$ to $R^{22}$ may be independently a group of the formula —CH$_2$C(=O)CH$_{(3-n)}$Y$_n$, where each Y is independently substituted or unsubstituted $C_{3-10}$ heterocycloalkyl and n is 1 or 2. For example, each Y may be independently substituted or unsubstituted $C_{3-10}$ heterocycloalkyl including a group of the formula —O(C$^{a1}$)(C$^{a2}$)O—, wherein C$^{a1}$ and C$^{a2}$ are each independently hydrogen or substituted or unsubstituted alkyl, and where C$^{a1}$ and C$^{a2}$ together optionally form a ring.

In Formula (8), $R^{23}$ to $R^{25}$ may each independently be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl, provided that no more than one of $R^{23}$ to $R^{25}$ may be hydrogen, and provided that if one of $R^{23}$ to $R^{25}$ is hydrogen, then at least one of the others from $R^{23}$ to $R^{25}$ is substituted or unsubstituted $C_{6-20}$ aryl or substituted or unsubstituted $C_{3-20}$ heteroaryl. Each of $R^{23}$ to $R^{25}$ may optionally further comprise a divalent linking group as part of its structure. Any two of $R^{23}$ to $R^{25}$ optionally may form a ring together, which may further include a divalent linking group as part of its structure.

In Formula (8), X is a carbon-carbon unsaturated vinylic group selected from substituted or unsubstituted $C_{2-20}$ alkenyl or substituted or unsubstituted norbornyl.

In Formula (8), $L^6$ may be a single bond or a divalent linking group, provided that $L^7$ is not a single bond when X$^a$ is substituted or unsubstituted $C_{2-20}$ alkenyl. Preferably, $L^7$ is substituted or unsubstituted $C_{6-30}$ arylene, or substituted or unsubstituted $C_{6-30}$ cycloalkylene.

In Formulae (8), n1 is 0 or 1. It is to be understood that when n1 is 0, the $L^6$ group is connected directly to the oxygen atom.

In some aspects, when the polymer further includes a repeating unit comprising an acid-labile group, the acid-labile group may be a tertiary alkyl ester. For example, the repeating unit comprising the tertiary alkyl ester group may be derived from one or more monomers of Formulae (6), (7), or (8), wherein none of $R^{17}$ to $R^{22}$ is hydrogen, and n1 is 1.
Non-limiting examples of monomers represented by Formula (6) include:
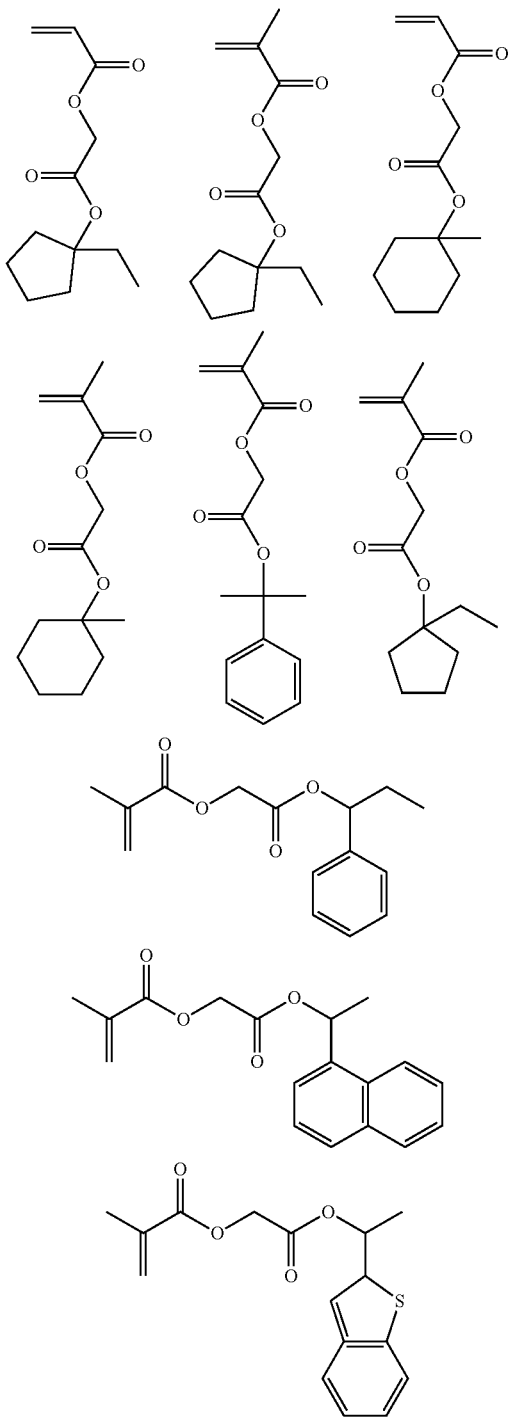
Non-limiting examples of monomers represented by Formula (7) include:
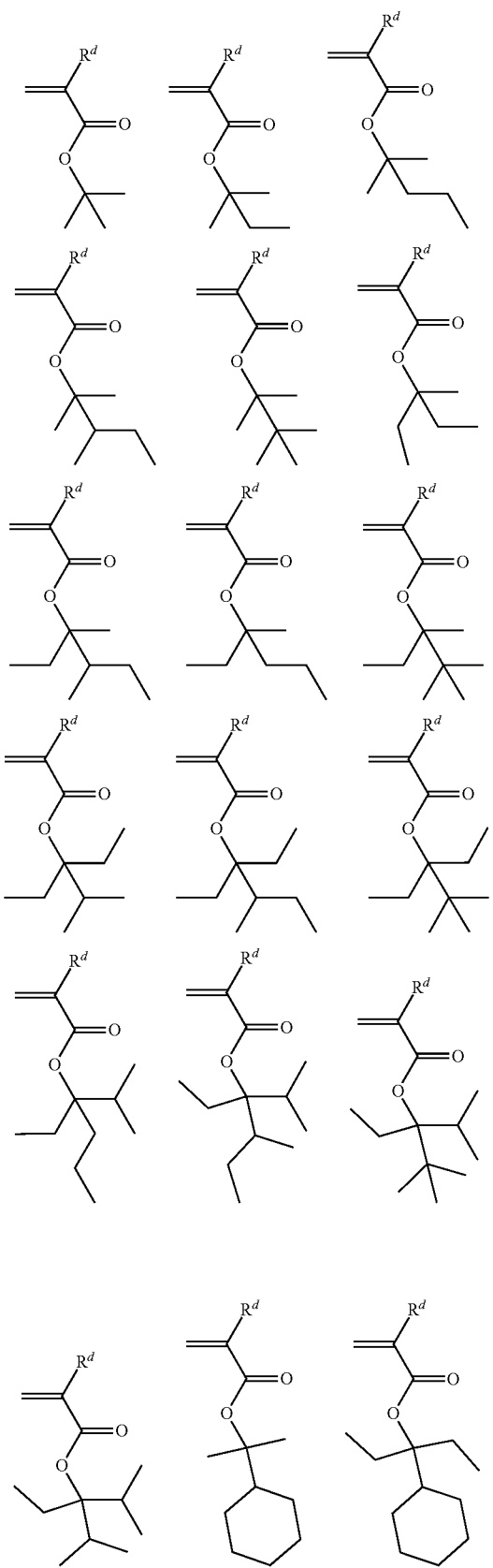

-continued
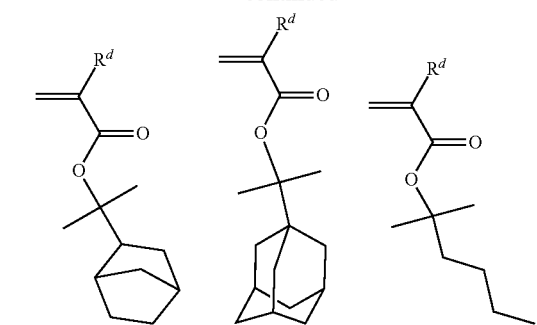
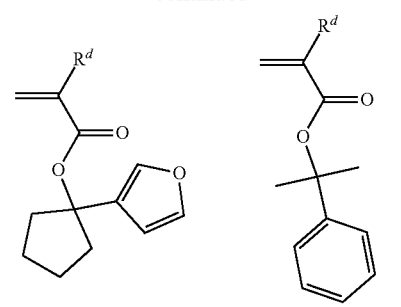
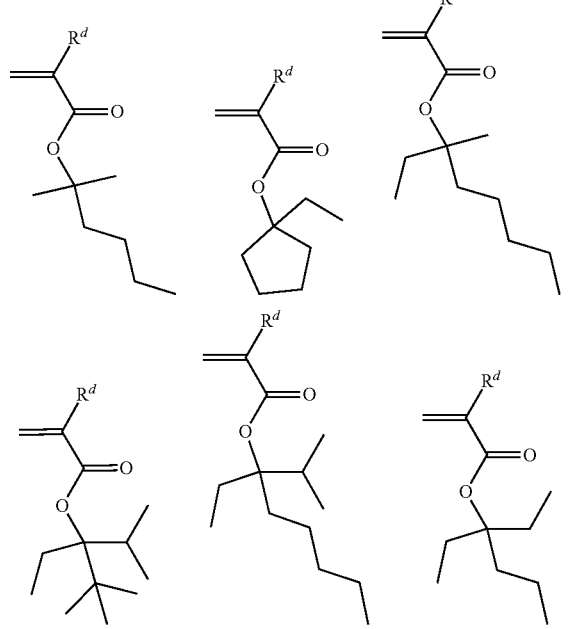
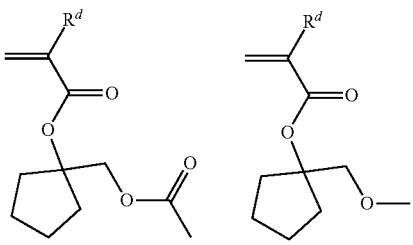
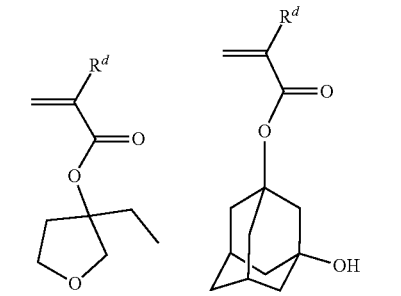
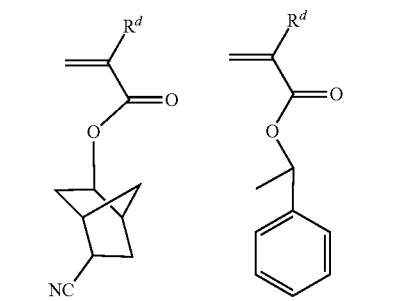
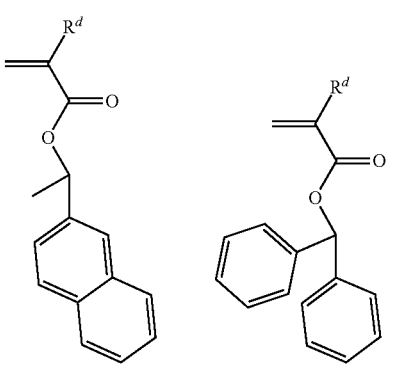

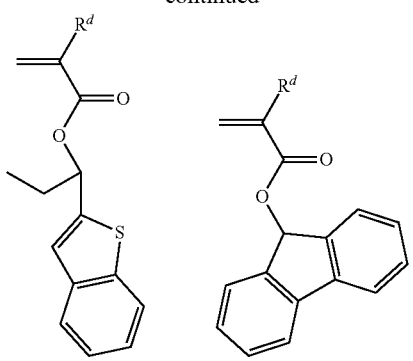

wherein $R^d$ is as defined herein for $R^i$ in Formula (7); and R' and R'' are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{3-20}$ heteroaryl.

Non-limiting examples of monomers represented by Formula (8) include:

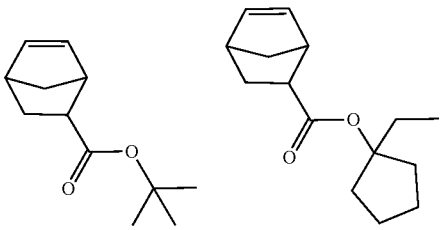

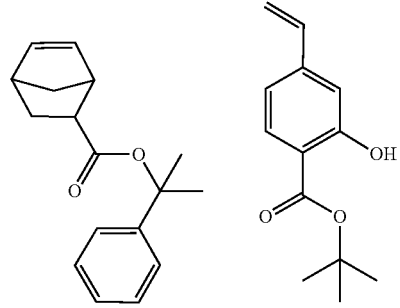

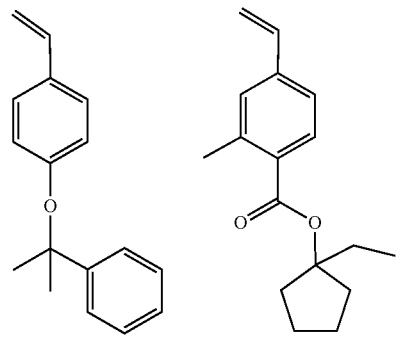

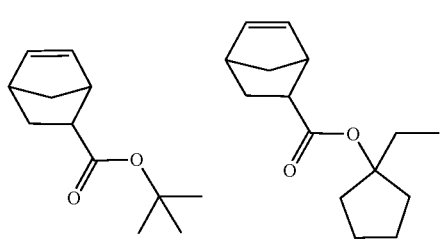

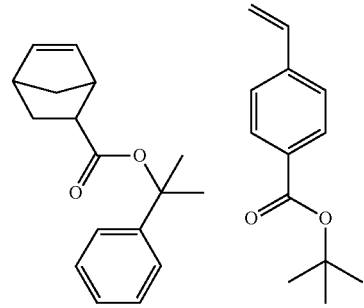

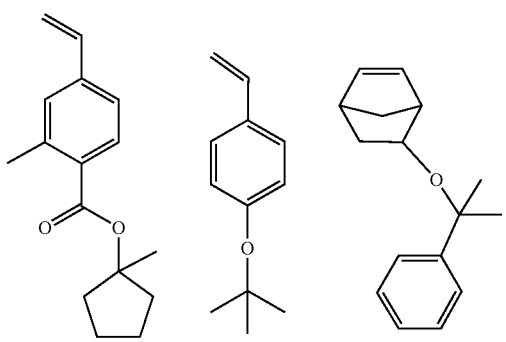

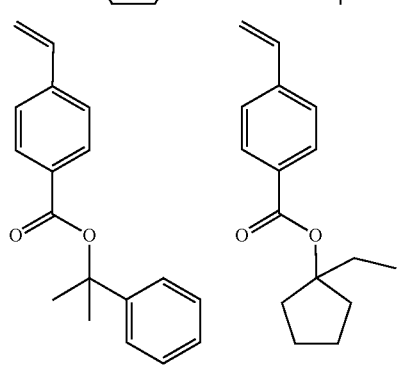

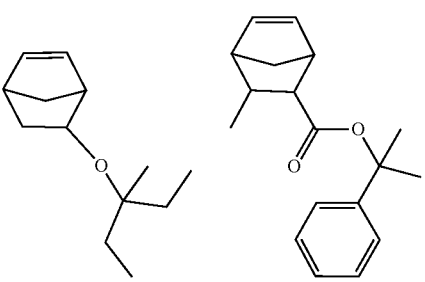

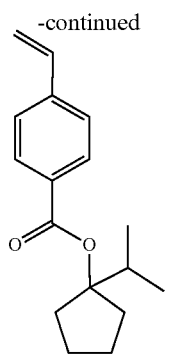

The repeating unit comprising the acid-labile group may be derived from one or more monomers having a tertiary alkoxy group, for example, of the formulae:

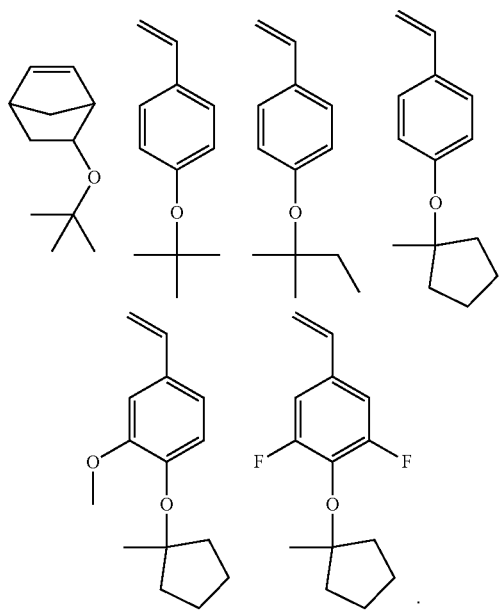

When present, polymer typically comprises a repeating unit comprising an acid-labile group in an amount from 1 to 80 mol %, more typically from 5 to 75 mol %, still more typically from 5 to 50 mol %, based on total repeating units in the polymer.

The polymer may include two or more different repeating units that each comprise an acid-labile group. For example, the polymer may include a third repeating unit comprising an acid-labile group, wherein the third repeating unit is structurally different from the second repeating unit, and a fourth repeating unit comprising an acid-labile group, wherein the fourth repeating unit comprises a tertiary alkyl ester. When the polymer includes two or more different repeating units that each comprise an acid-labile group, the total amount of repeating units comprising acid-labile groups in the polymer may be in an amount from 1 to 80 mol %, more typically from 5 to 75 mol %, still more typically from 5 to 50 mol %, based on total repeating units in the polymer.

The polymer may optionally further comprise a repeating unit comprising a polar group that is pendant to the backbone of the polymer. Exemplary polar groups include lactones wherein the lactone ring is pendant to the backbone of the polymer, base-soluble repeating units (e.g., base-soluble repeating units having a pKa of less than or equal to 12), other repeating units including heteroatom-containing moieties, and repeating units including substituent groups that are further substituted with heteroatom-containing moieties. Exemplary heteroatom-containing moieties that may be the polar group of the present invention include, but are not limited to, nitro (—$NO_2$), cyano (—CN), amino (—$NR_2$, wherein $R_2$ is hydrogen, $C_{1-10}$ alkyl, $C_{6-12}$ aryl, $C_{3-12}$ heteroaryl, or a combination thereof), hydroxyl (—OH), alkoxy, carboxyl, aryloxy, thiol (—SH), arylthio, and sulfonyl.

For example, the polymer may further comprise a lactone-containing repeating unit, wherein the lactone ring is pendant to the backbone of the polymer, which may be derived from a monomer of Formula (9):

$$(9)$$

In Formula (9), $R^J$ may be hydrogen, fluorine, cyano, or substituted or unsubstituted $C_{1-10}$ alkyl. Preferably, $R^J$ is hydrogen, fluorine, or substituted or unsubstituted $C_{1-5}$ alkyl, typically methyl. $L^7$ may be a single bond or a divalent linking group. R may be a substituted or unsubstituted $C_{4-20}$ lactone-containing group or a substituted or unsubstituted polycyclic $C_{4-20}$ sultone-containing group, each of which may be a monocyclic, non-fused polycyclic, or fused polycyclic group.

Non-limiting examples of monomers of Formula (9) include the following:

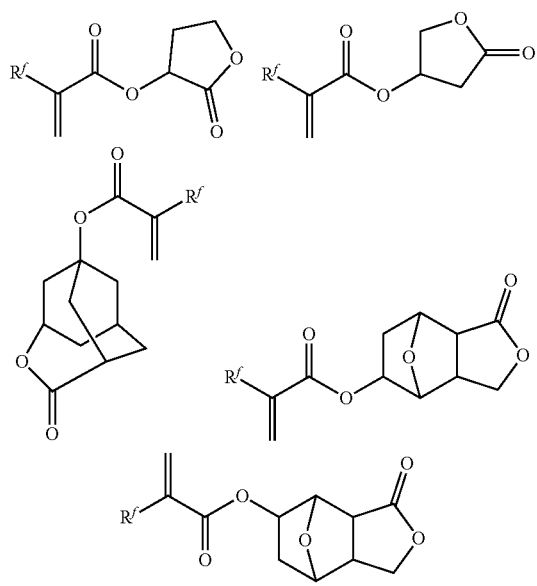

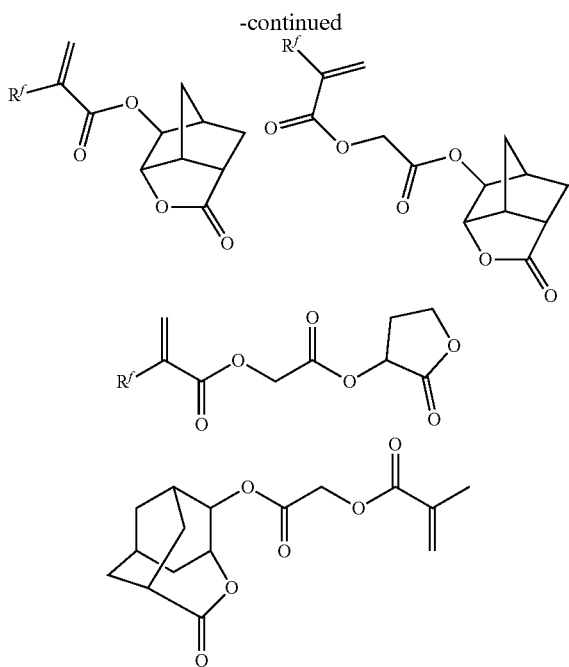

wherein $R^f$ is the same as defined for $R^j$ in Formula (9).

When a repeating unit including a lactone ring is present, the polymer typically comprises the lactone repeating unit in an amount from 1 to 70 mol %, typically 5 to 60 mol %, more typically 5 to 50 mol %, based on total moles of repeating units in the polymer.

In some embodiments, the polymer may further include a base-soluble repeating unit having a pKa of less than or equal to 12. For example, the base-soluble repeating unit can be derived from a monomer of Formulae (10), (11), (12), or a combination thereof:

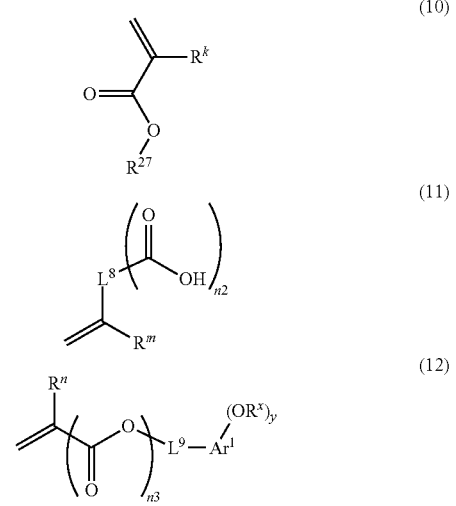

In Formulae (10) to (12), $R^k$, $R^m$, and $R^n$ are each independently hydrogen, fluorine, cyano, or substituted or unsubstituted $C_{1-10}$ alkyl. Preferably, $R^k$, $R^m$, and $R^n$ are each independently hydrogen, fluorine, or substituted or unsubstituted $C_{1-5}$ alkyl, typically methyl.

In Formula (10), $R^{27}$ may be substituted or unsubstituted $C_{1-100}$ or $C_{1-20}$ alkyl, typically $C_{1-12}$ alkyl; substituted or unsubstituted $C_{3-30}$ or $C_{3-20}$ cycloalkyl; or substituted or unsubstituted poly($C_{1-3}$ alkylene oxide). Preferably, the substituted $C_{1-100}$ or $C_{1-20}$ alkyl, the substituted $C_{3-30}$ or $C_{3-20}$ cycloalkyl, and the substituted poly($C_{1-3}$ alkylene oxide) are substituted with one or more of halogen, a fluoroalkyl group such as a $C_{1-4}$ fluoroalkyl group, typically fluoromethyl, a sulfonamide group —NH—S(O)$_2$—Y$^1$ where Y$^1$ is F or $C_{1-4}$ perfluoroalkyl (e.g., —NHSO$_2$CF$_3$), or a fluoroalcohol group (e.g., —C(CF$_3$)$_2$OH).

In Formula (11), $L^8$ represents a single bond or a multivalent linking group chosen, for example, from optionally substituted aliphatic, such as $C_{1-6}$ alkylene or $C_{3-20}$ cycloalkylene, and aromatic hydrocarbons, and combinations thereof, optionally with one or more linking moieties chosen from —O—, —S—, —C(O)—, and —NR$^{102}$— wherein $R^{102}$ is chosen from hydrogen and optionally substituted $C_{1-10}$ alkyl; and n2 is an integer from 1 to 5, typically 1. For example, the polymer may further include a repeating unit derived from one or more monomers of Formula (11) wherein L is a single bond or a multivalent linking group selected from substituted or unsubstituted $C_{1-20}$ alkylene, typically $C_{1-6}$ alkylene; substituted or unsubstituted $C_{3-20}$ cycloalkylene; typically, $C_{3-10}$ cycloalkylene; and substituted or unsubstituted $C_{6-24}$ arylene, and n2 is 1, 2, or 3.

In Formula (12), n3 is 0 or 1, and $L^9$ may be a single bond or a divalent linking group. Preferably, $L^9$ may be a single bond, substituted or unsubstituted $C_{6-30}$ arylene, or substituted or unsubstituted $C_{6-30}$ cycloalkylene. $Ar^1$ is a substituted $C_{5-60}$ aromatic group that optionally includes one or more aromatic ring heteroatoms chosen from N, O, S, or a combination thereof, wherein the aromatic group may be monocyclic, non-fused polycyclic, or fused polycyclic. When the $C_{5-60}$ aromatic group is polycyclic, the ring or ring groups may be fused (such as naphthyl or the like), non-fused, or a combination thereof. When the polycyclic $C_{5-60}$ aromatic group is non-fused, the ring or ring groups may be directly linked (such as biaryls, biphenyl, or the like) or may be bridged by a heteroatom (such as triphenylamino or diphenylene ether). In some aspects, the polycyclic $C_{5-60}$ aromatic group may include a combination of fused rings and directly linked rings (such as binaphthyl or the like). y may be an integer from 1 to 12, preferably from 1 to 6, and typically from 1 to 3. Each $R^x$ may independently be hydrogen or methyl.

Non-limiting examples of monomers that may be used to provide a base-soluble repeating unit include:

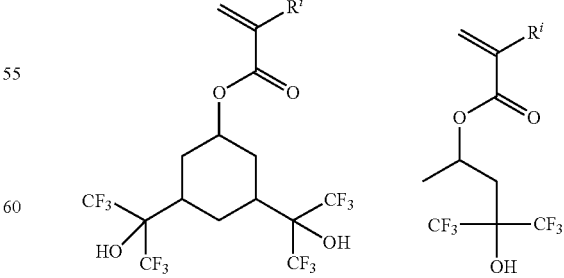

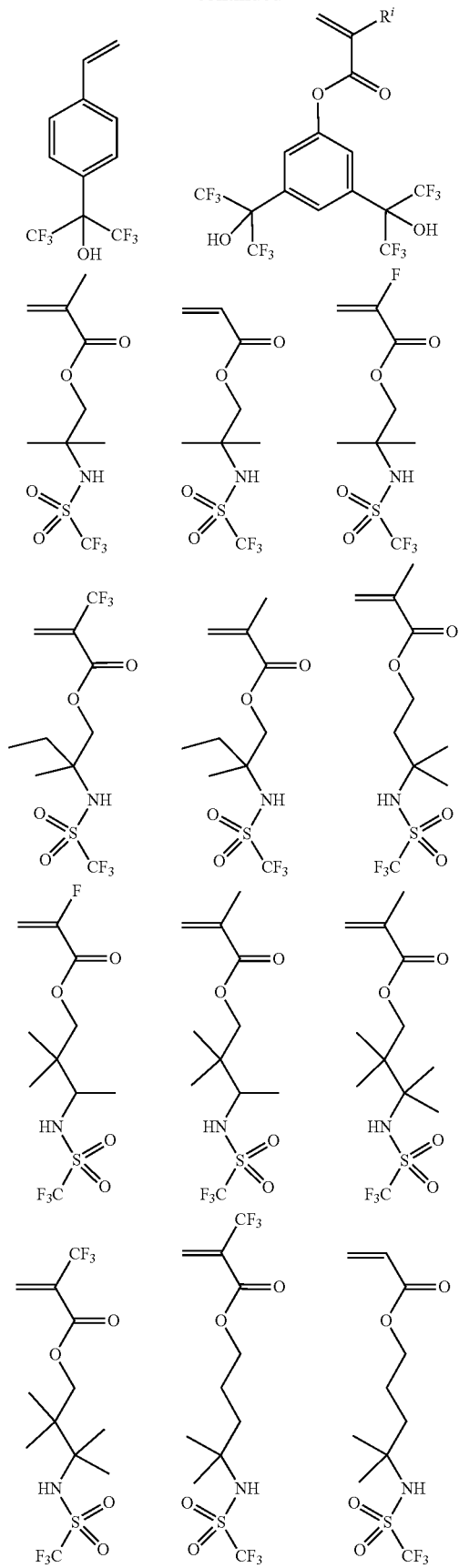
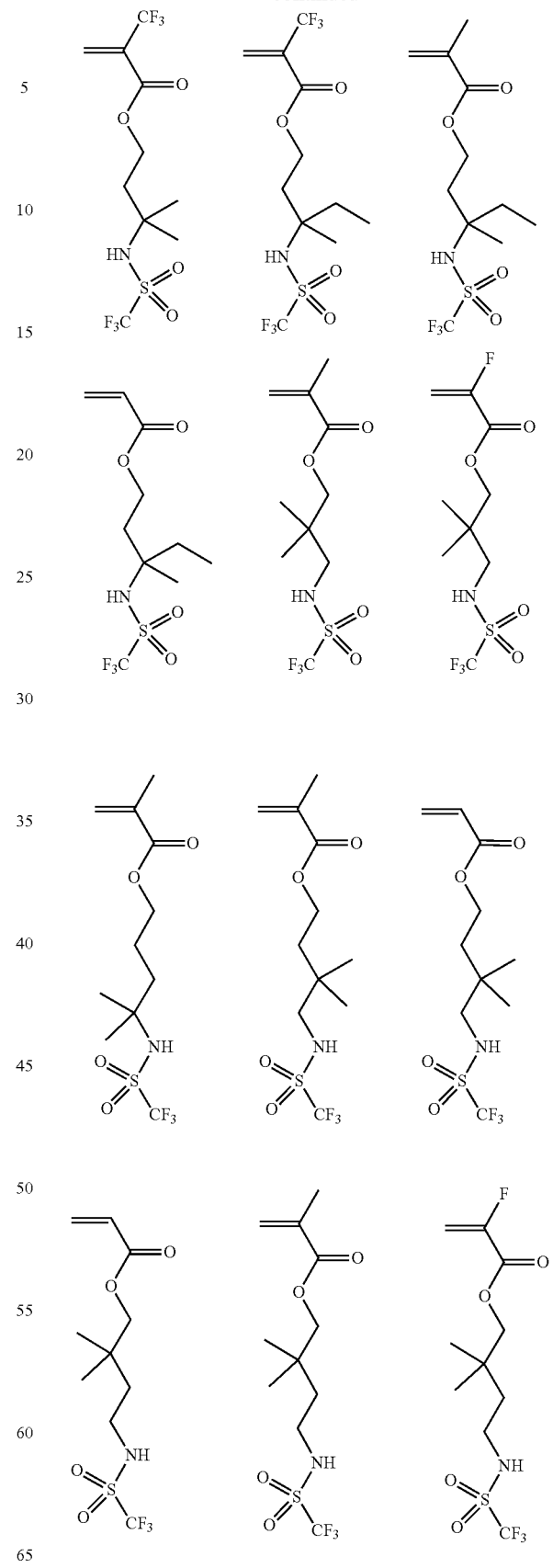

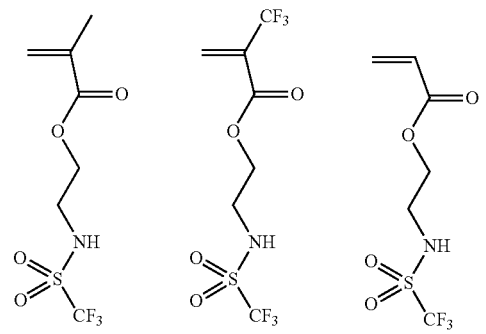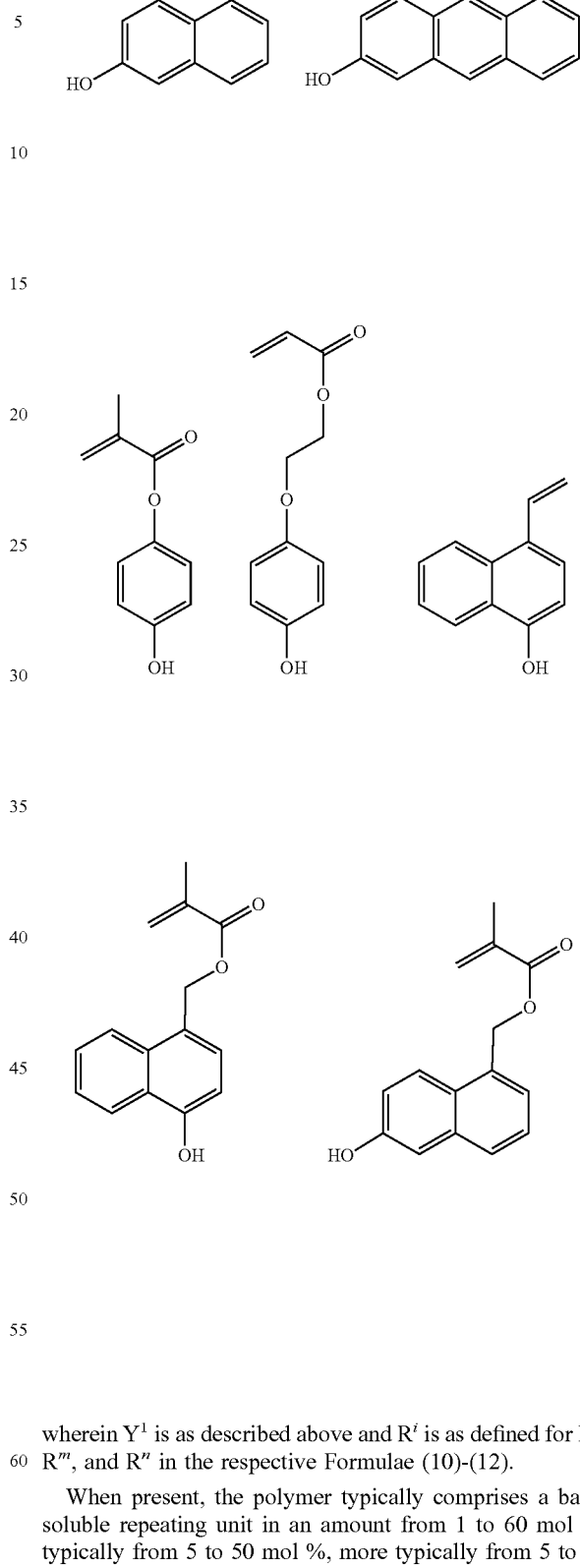

wherein $Y^1$ is as described above and $R^i$ is as defined for $R^k$, $R^m$, and $R^n$ in the respective Formulae (10)-(12).

When present, the polymer typically comprises a base-soluble repeating unit in an amount from 1 to 60 mol %, typically from 5 to 50 mol %, more typically from 5 to 40 mol %, based on total repeating units in the polymer.

Non-limiting exemplary polymers of the present invention include the following:

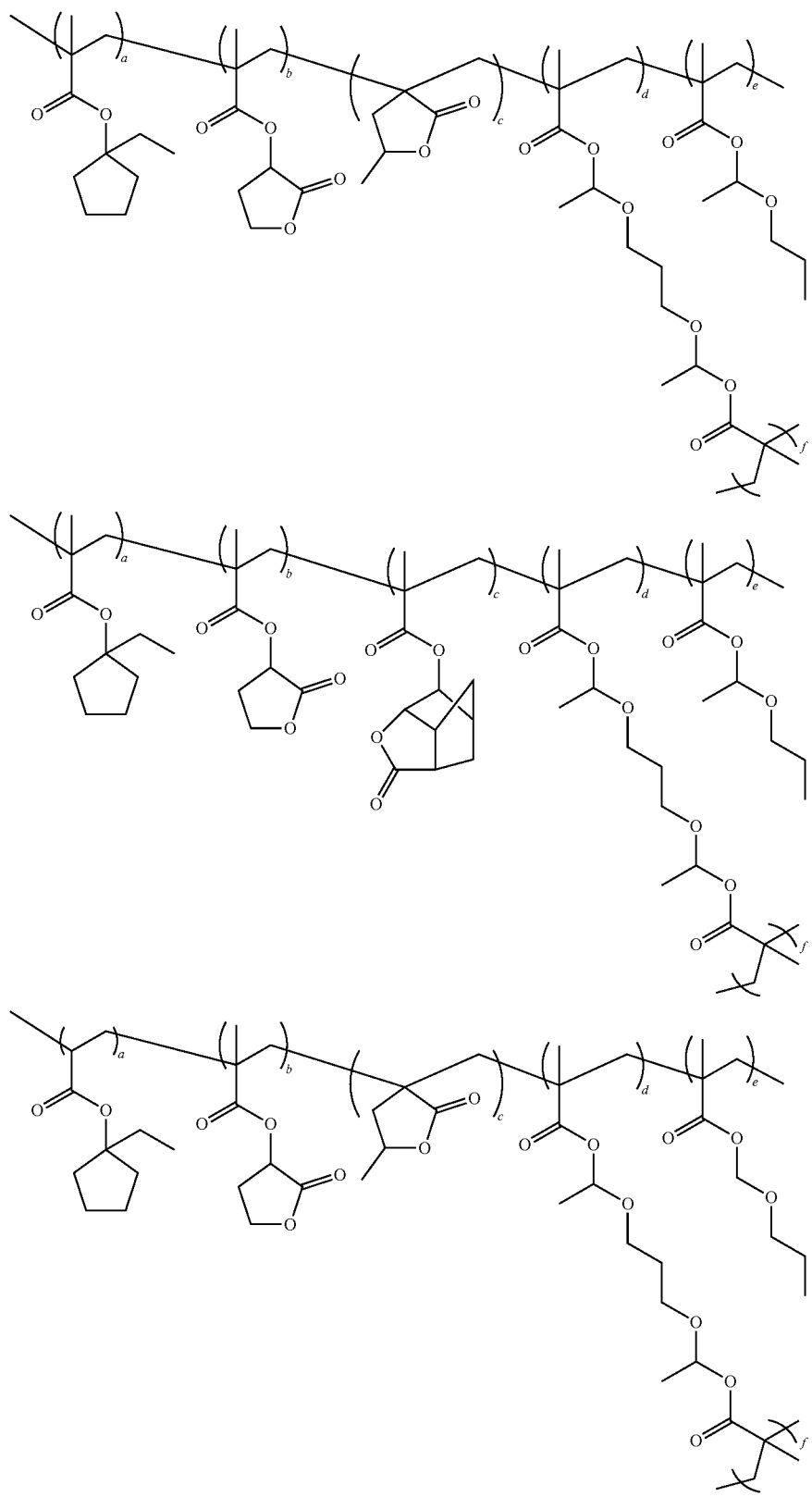

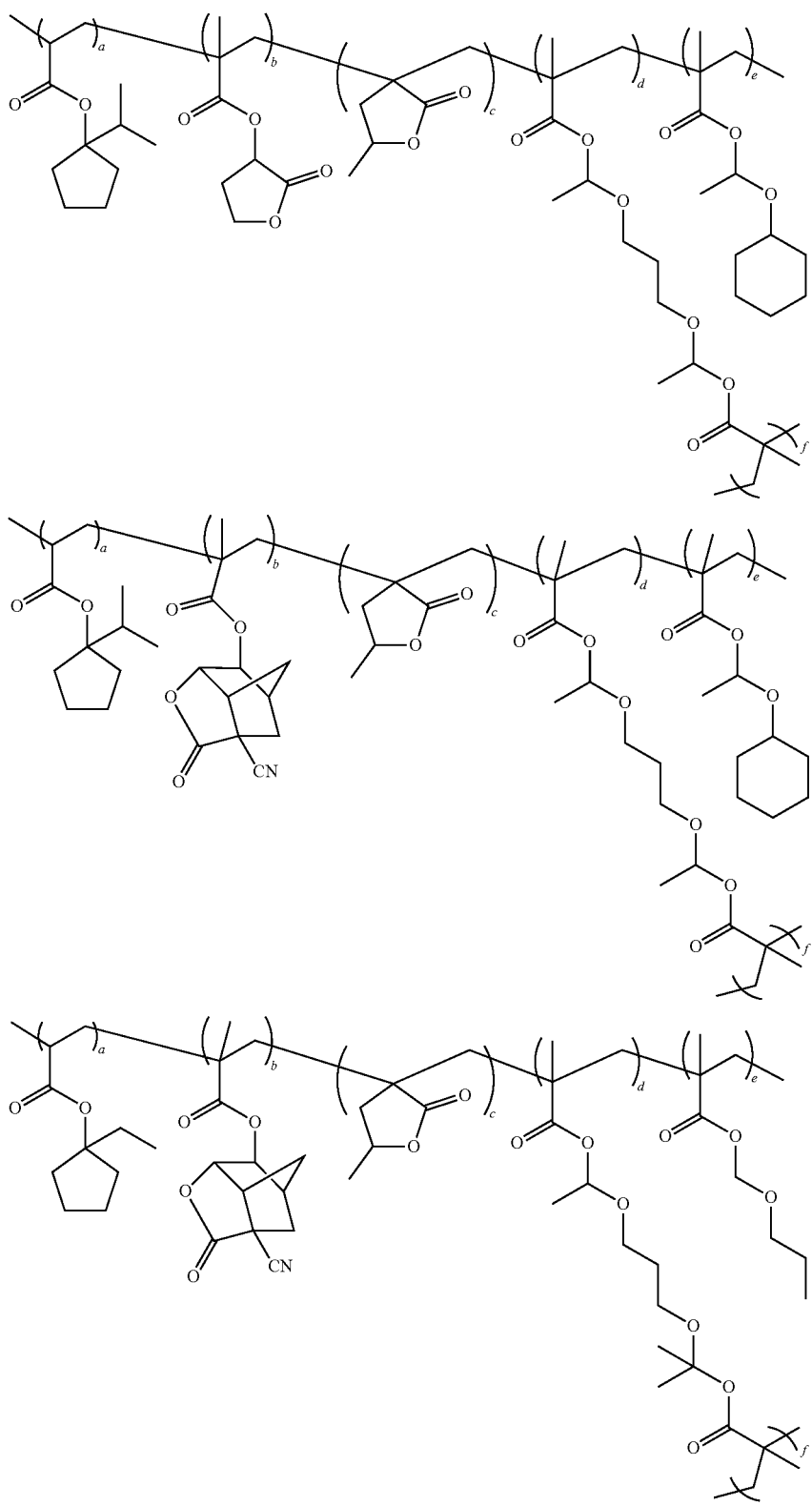

wherein a, b, c, d, and e each represent the mol % of the repeating unit based on 100 mol % of total repeating units in the polymer.

The polymer typically has a weight average molecular weight ($M_w$) from 1,000 to 50,000 Dalton (Da), preferably from 2,000 to 30,000 Da, more preferably 4,000 to 20,000 Da, and still more preferably from 5,000 to 15,000 Da. The PDI of the polymer is typically from 1.1 to 3, and more typically from 1.1 to 2. Molecular weights are determined by gel permeation chromatography (GPC) using polystyrene standards.

It is to be understood that the polymers described herein may optionally include one or more additional repeating unit(s) different from the repeating units described above. The additional repeating units may include, for example, one or more additional units for purposes of adjusting properties of the photoresist underlayer composition, such as etch rate and solubility. Exemplary additional units may include one or more of (meth)acrylate, vinyl ether, vinyl ketone, and vinyl ester. The one or more additional repeating units if present in the polymer are typically used in an amount of up to 99 mol %, and typically from 3 to 80 mol %, based on total repeating units of the respective polymer.

Suitable polymers of the present invention can be readily prepared based on and by analogy with the procedures described in the examples of the present application, which are readily understood by those of ordinary skill in the art. For example, one or more monomers corresponding to the repeating units described herein may be combined, or fed separately, using suitable solvent(s) and initiator, and polymerized in a reactor. The monomer composition may further include additives, such as a solvent, a polymerization initiator, a curing catalyst (i.e., the acid catalyst), and the like. For example, the polymer may be obtained by polymerization of the respective monomers under any suitable conditions, such as by heating at an effective temperature, irradiation with activating radiation at an effective wavelength, or a combination thereof. In some aspects, the monomer composition further includes a curing agent.

Also provided is a photoresist composition including the inventive polymer, a photoacid generator (PAG), and a solvent.

The photoresist composition may further include one or more polymers ("additional polymers") in addition to the inventive polymers described above. For example, the photoresist composition may further include an additional polymer as described above but different in composition. Additionally, or alternatively, the one or more additional polymers can include those well known in the art, for example, one or more polymers selected from polyacrylates, polyvinylethers, polyesters, polynorbonenes, polyacetals, polyethylene glycols, polyamides, polyacrylamides, polyphenols, novolacs, styrenic polymers, polyvinyl alcohols, copolymers thereof, and combination thereof.

Suitable PAGs can generate an acid that, during post-exposure bake (PEB), causes cleavage of acid-labile groups present on a polymer of the photoresist composition. The PAG may be in non-polymeric form or in polymeric form, for example, present in a polymerized repeating unit of the polymer as described above, or as part of a different polymer. Suitable non-polymeric PAG compounds may have formula $G^+A^-$, wherein $G^+$ is an organic cation chosen from iodonium cations substituted with two alkyl groups, two aryl groups, or a combination of alkyl and aryl groups; and sulfonium cations substituted with three alkyl groups, three aryl groups, or a combination of alkyl and aryl groups, and $A^-$ is a non-polymerizable organic anion. In some embodiments, PAG may be included as a non-polymerized PAG compound, as a repeating unit of a polymer having a PAG moiety that is derived from a polymerizable PAG monomer, or as a combination thereof.

Particularly suitable non-polymeric organic anions include those, the conjugated acids of which have a pKa of from −15 to 1. Particularly preferred anions are fluorinated alkyl sulfonates and fluorinated sulfonimides.

Suitable non-polymeric PAG compounds are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Non-ionic sulfonates and sulfonyl compounds are also known to function as photoacid generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable non-polymerized photoacid generators are further described in U.S. Pat. No. 8,431,325 to Hashimoto et al. in column 37, lines 11-47 and columns 41-91. Other suitable sulfonate PAGs include sulfonated esters and sulfonyloxy ketones, nitrobenzyl esters, s-triazine derivatives, benzoin tosylate, t-butylphenyl α-(p-toluenesulfonyloxy) acetate, and t-butyl α-(p-toluenesulfonyloxy)-acetate as described in U.S. Pat. Nos. 4,189,323 and 8,431,325.

Typically, when the photoresist composition includes a non-polymeric photoacid generator, it is present in the photoresist composition in an amount of from 1 to 65 wt %, more typically 2 to 20 wt %, based on total solids of the photoresist composition.

In some embodiments, $G^+$ may be a sulfonium cation of Formula (13A) or an iodonium cation of Formula (13B):

(13A)

(13B)

In Formulae (13A) and (13B), each $R^{aa}$ is independently substituted or unsubstituted $C_{1-20}$ alkyl, substituted or unsubstituted $C_{3-20}$ cycloalkyl, substituted or unsubstituted $C_{2-20}$ alkenyl, substituted or unsubstituted $C_{6-30}$ aryl, substituted or unsubstituted $C_{6-30}$ iodoaryl, substituted or unsubstituted $C_{3-30}$ heteroaryl, substituted or unsubstituted $C_{7-20}$ arylalkyl, or substituted or unsubstituted $C_{4-20}$ heteroarylalkyl. Each $R^{aa}$ may be either separate or connected to another group $R^a$ via a single bond or a divalent linking group to form a ring. Each $R^{aa}$ optionally may include as part of its structure a divalent linking group. Each $R^{aa}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Suitable divalent linking groups for connection of $R^{aa}$ groups include, for example, —O—, —S—, —Te—, —Se—, —C(O)—, —C(S)—, —C(Te)—, or —C(Se)—, substituted or unsubstituted $C_{1-5}$ alkylene, or a combination thereof.

Exemplary sulfonium cations of formula (13A) include the following:

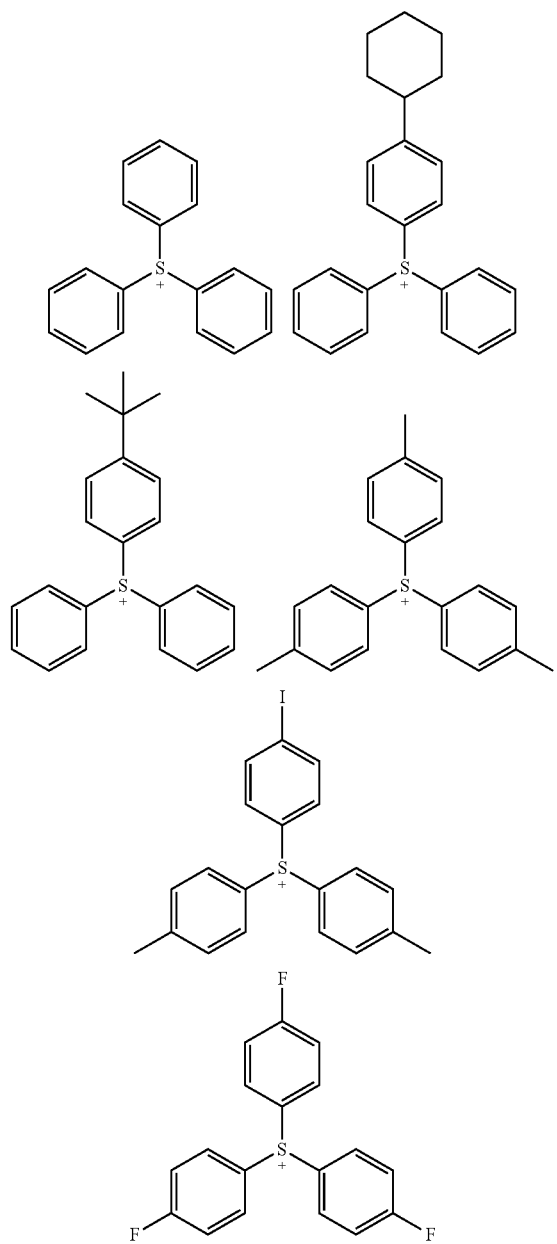
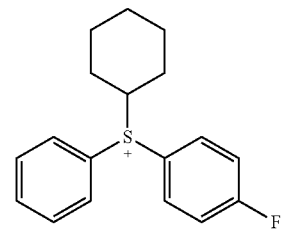
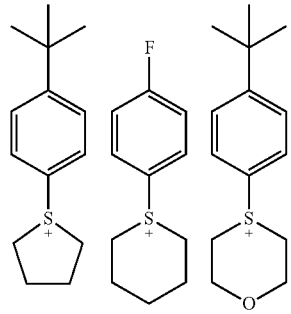
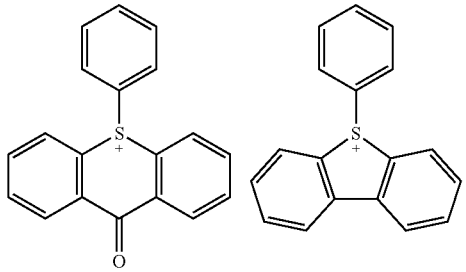
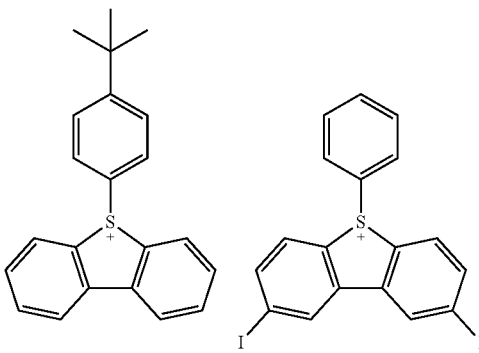
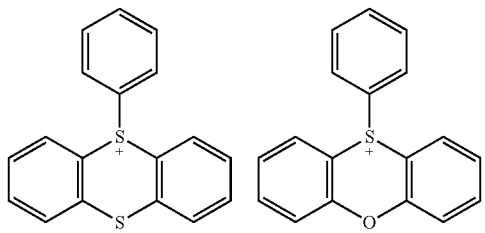
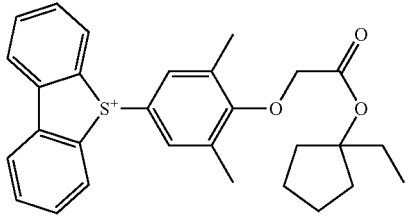

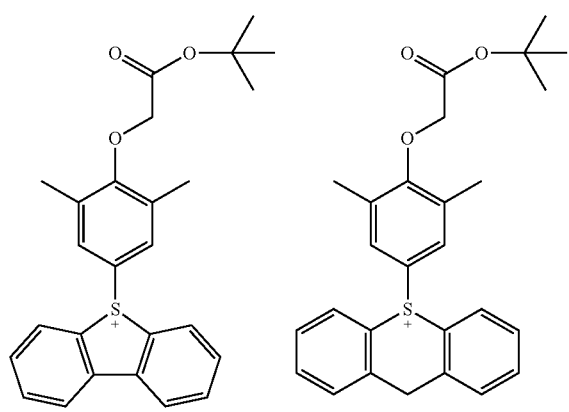
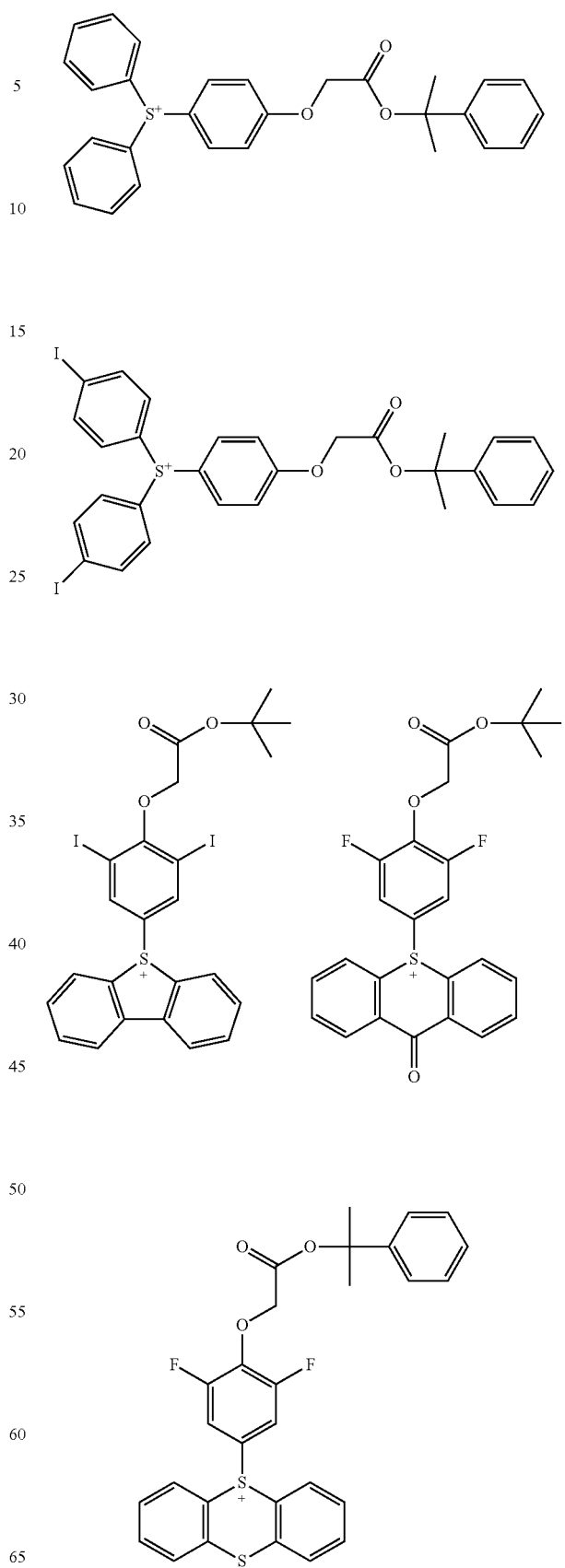

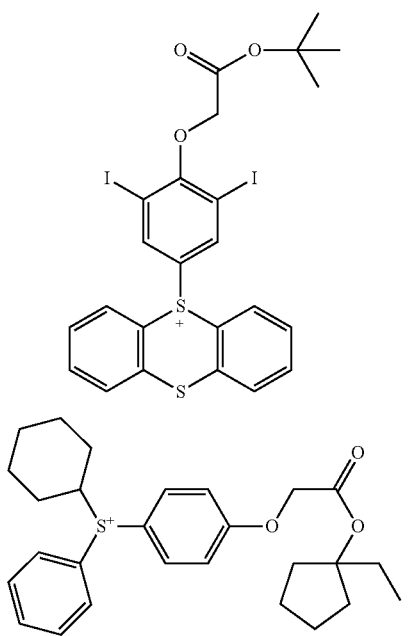
Exemplary iodonium cations of formula (13B) include the following:
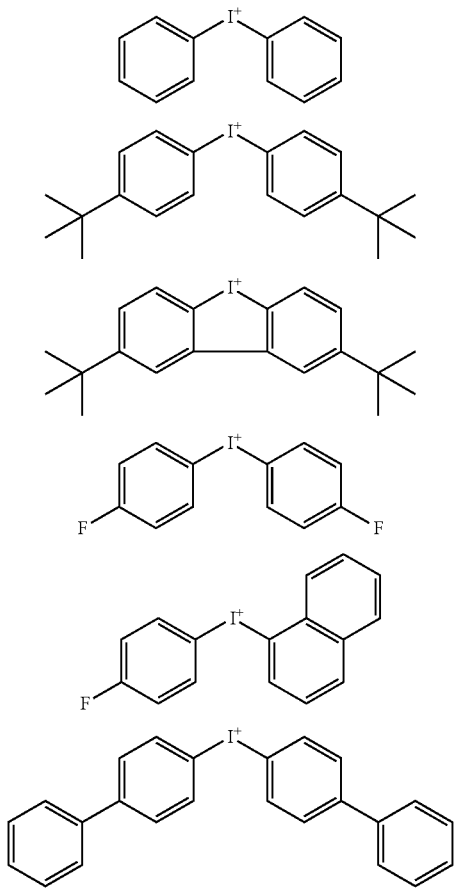
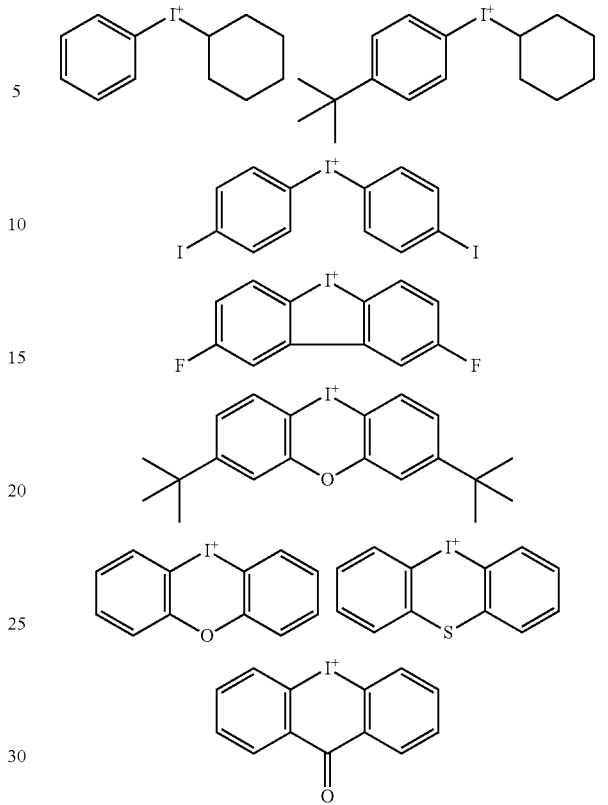
PAGs that are onium salts typically comprise an organic anion A⁻ having a sulfonate group or a non-sulfonate-type group, such as sulfonamidate, sulfonimidate, methide, or borate.
Exemplary organic anions having a sulfonate group include the following:

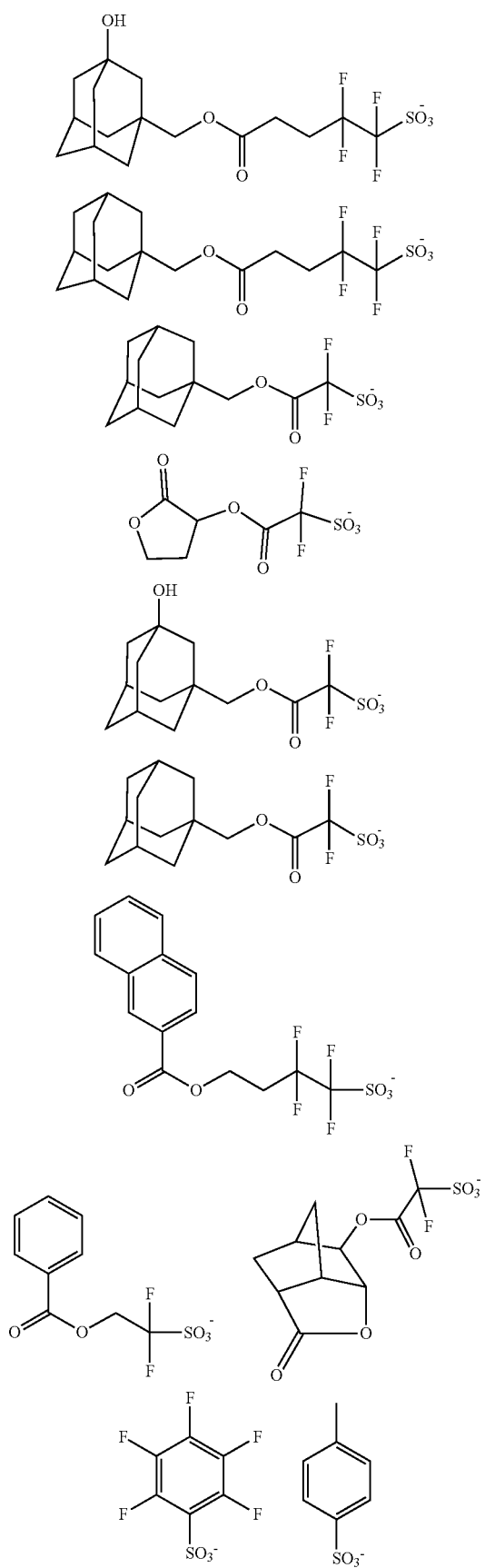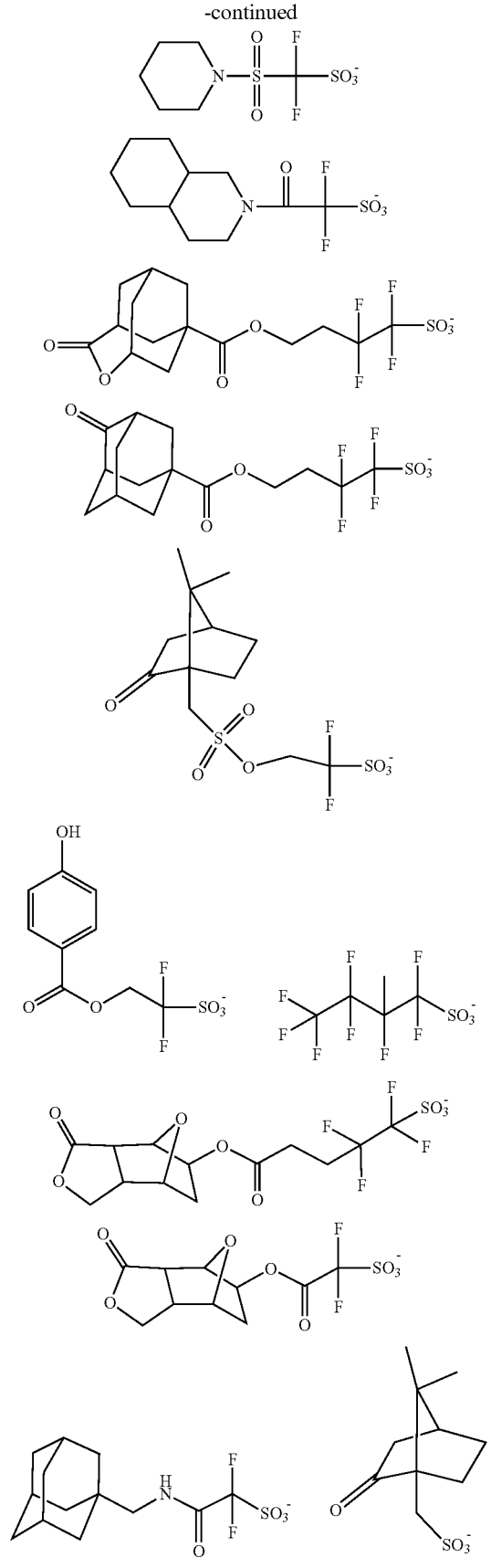

-continued

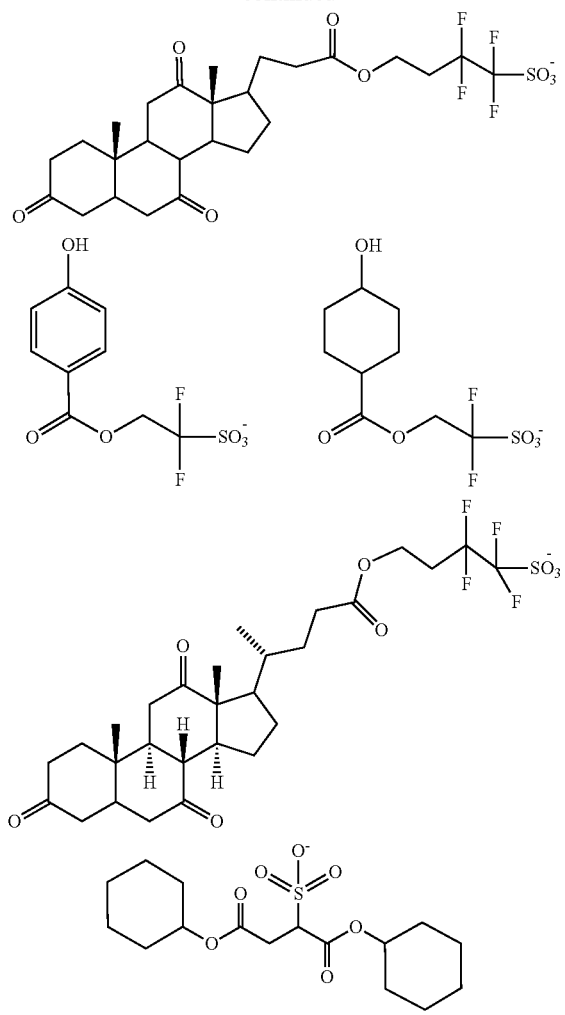

Exemplary non-sulfonated anions include the following:

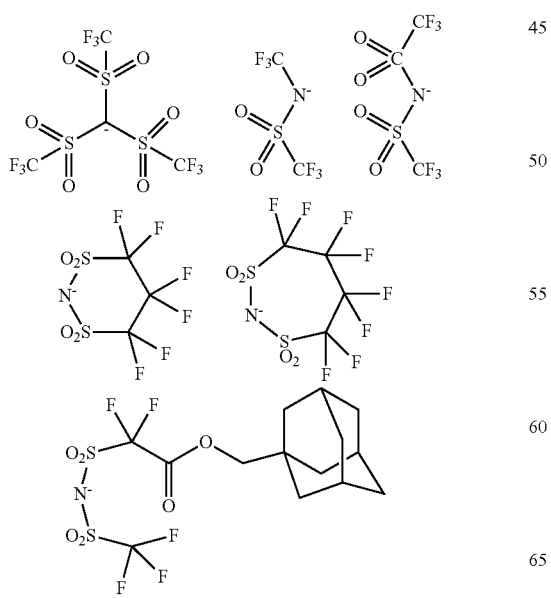

The photoresist composition may optionally comprise a plurality of PAGs. The plurality PAGs may be polymeric, non-polymeric, or may include both polymeric and non-polymeric PAGs. Preferably, each PAG of the plurality of PAGs is non-polymeric.

In one or more aspects, the photoresist composition may include a first photoacid generator that includes a sulfonate group on the anion, and the photoresist composition may include a second photoacid generator that is non-polymeric, wherein the second photoacid generator may include an anion that is free of sulfonate groups.

In some aspects, an acid-labile polymer may be used that includes a repeating unit comprising a PAG moiety. For example, the acid-labile polymer may include a repeating unit derived from one or more monomers of Formula (14):

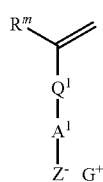
(14)

wherein $R^m$ may be hydrogen, fluorine, cyano, or substituted or unsubstituted $C_{1-10}$ alkyl. Preferably, $R^m$ is hydrogen, fluorine, or substituted or unsubstituted $C_{1-5}$ alkyl, typically methyl. $Q^1$ may be a single bond or a divalent linking group. Preferably, $Q^1$ may include 1 to 10 carbon atoms and at least one heteroatom, more preferably —C(O)—O—.

In Formula (14), $A^1$ may be one or more of substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, or substituted or unsubstituted $C_{3-30}$ heteroarylene. Preferably, $A^1$ may be a divalent $C_{1-30}$ perfluoroalkylene group that is optionally further substituted.

In Formula (14), $Z^-$ is an anionic moiety, the conjugated acid of which typically has a pKa from −15 to 1. $Z^-$ may be a sulfonate, a carboxylate, an anion of a sulfonamide, an anion of a sulfonimide, or a methide anion. Particularly preferred anion moieties are fluorinated alkyl sulfonates and fluorinated sulfonimides.

In Formula (14), $G^+$ is an organic cation as defined above. In some embodiments, $G^+$ is an iodonium cation substituted with two alkyl groups, two aryl groups, or a combination of alkyl and aryl groups; or a sulfonium cation substituted with three alkyl groups, three aryl groups, or a combination of alkyl and aryl groups.

In some aspects, the inventive polymer optionally may further comprise a repeating unit comprising a PAG moiety, wherein the repeating unit is derived from one or more monomers of Formula (14).

Exemplary monomers of Formula (14) include the following:

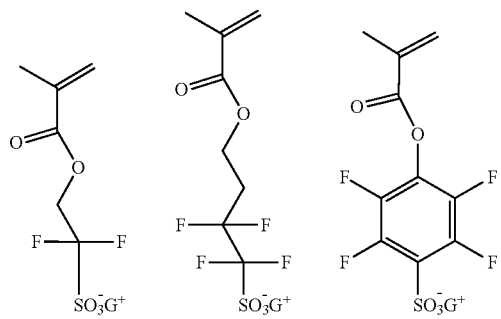

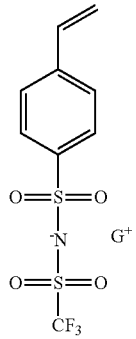

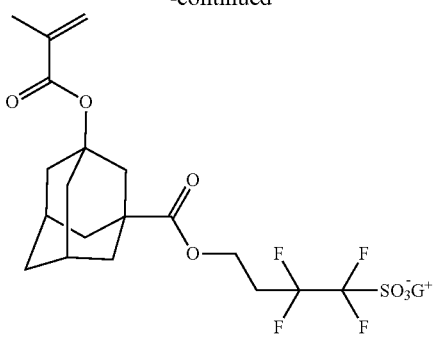

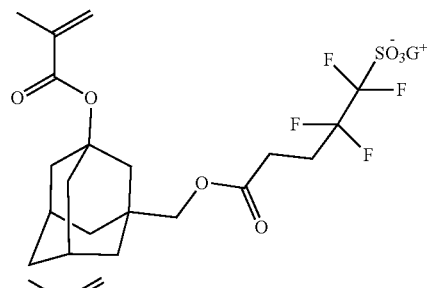

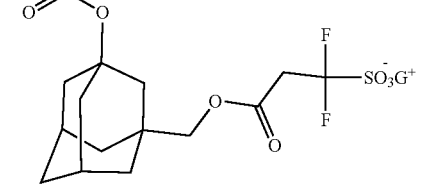

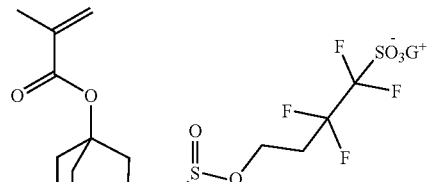

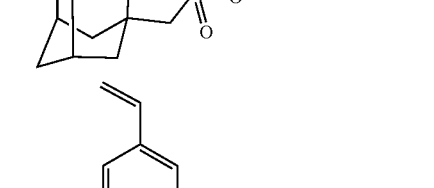

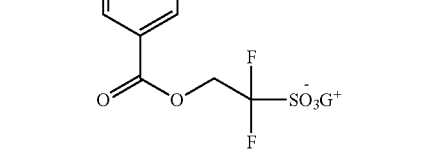

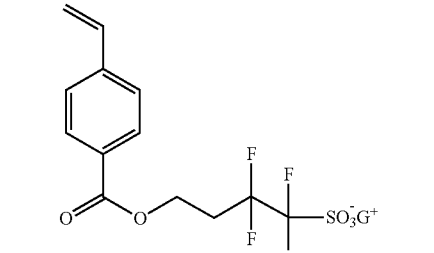

wherein $G^+$ is the organic cation.

The polymer and/or an acid-labile polymer may include a repeating unit comprising a PAG moiety in an amount from 1 to 15 mol %, typically from 1 to 8 mol %, more typically from 2 to 6 mol %, based on total repeating units in the polymer and/or the acid-labile polymer.

The photoresist composition further includes a solvent for dissolving the components of the composition and facilitating its coating on a substrate. Preferably, the solvent is an organic solvent conventionally used in the manufacture of electronic devices. Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane; alcohols such as methanol, ethanol, 1-propanol, iso-propanol, tert-butanol, 2-methyl-2-butanol, 4-methyl-2-pentanol, and diacetone alcohol (4-hydroxy-4-methyl-2-pentanone); propylene glycol monomethyl ether (PGME); ethers such as diethyl ether, tetrahydrofuran, 1,4-dioxane and anisole; ketones such as acetone, methyl ethyl ketone, methyl iso-butyl ketone, 2-heptanone and cyclohexanone (CHO); esters such as ethyl acetate, n-butyl acetate, propylene glycol monomethyl ether acetate (PGMEA), ethyl lactate (EL), hydroxyisobutyrate methyl ester (HBM) and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof. The total solvent content (i.e., cumulative solvent content for all solvents) in the photoresist compositions is typically from 40 to 99 wt %, for example, from 70 to 99 wt %, or from 85 to 99 wt %, based on total solids of the photoresist composition. The desired solvent content will depend, for example, on the desired thickness of the coated photoresist layer and coating conditions.

The polymer is typically present in the photoresist composition in an amount from 10 to 99.9 wt %, typically from 25 to 99 wt %, and more typically from 50 to 95 wt %, based on total solids of the photoresist composition. It will be understood that "total solids" includes the polymer(s), PAG(s), and other non-solvent components.

In some aspects, the photoresist composition may further include a material that comprises one or more base-labile groups (a "base-labile material"). As referred to herein, base-labile groups are functional groups that can undergo cleavage reaction to provide polar groups such as hydroxyl, carboxylic acid, sulfonic acid, and the like, in the presence of an aqueous alkaline developer after exposure and post-exposure baking steps. The base-labile group will not react significantly (e.g., will not undergo a bond-breaking reaction) prior to a development step of the photoresist composition that comprises the base-labile group. Thus, for instance, a base-labile group will be substantially inert during pre-exposure soft-bake, exposure, and post-exposure bake steps. By "substantially inert" it is meant that 5%, typically 1%, of the base-labile groups (or moieties) will decompose, cleave, or react during the pre-exposure soft-bake, exposure, and post-exposure bake steps. The base-labile group is reactive under typical photoresist development conditions using, for example, an aqueous alkaline photoresist developer such as a 0.26 normal (N) aqueous solution of tetramethylammonium hydroxide (TMAH). For example, a 0.26 N aqueous solution of TMAH may be used for single puddle development or dynamic development, e.g., where the 0.26 N TMAH developer is dispensed onto an imaged photoresist layer for a suitable time such as 10 to 120 seconds (s). An exemplary base-labile group is an ester group, typically a fluorinated ester group. Preferably, the base-labile material is substantially not miscible with and has a lower surface energy than the polymer and other solid components of the photoresist composition. When coated on a substrate, the base-labile material can thereby segregate from other solid components of the photoresist composition to a top surface of the formed photoresist layer.

In some aspects, the base-labile material may be a polymeric material, also referred to herein as a base-labile polymer, which may include one or more repeating units comprising one or more base-labile groups. For example, the base-labile polymer may comprise a repeating unit comprising 2 or more base-labile groups that are the same or different. A preferred base-labile polymer includes at least one repeating unit comprising 2 or more base-labile groups, for example a repeating unit comprising 2 or 3 base-labile groups.

The base-labile polymer may be a polymer comprising a repeating unit derived from one or more monomers of Formula (15A):

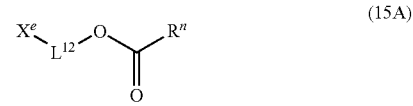

wherein $X^e$ is a carbon-carbon unsaturated vinylic group, $L^{12}$ is a divalent linking group; and $R^a$ is substituted or unsubstituted $C_{1-20}$ fluoroalkyl, provided that the carbon atom bonded to the carbonyl (C=O) in formula (15A) is substituted with at least one fluorine atom.

Exemplary monomers of Formula (15A) include the following:

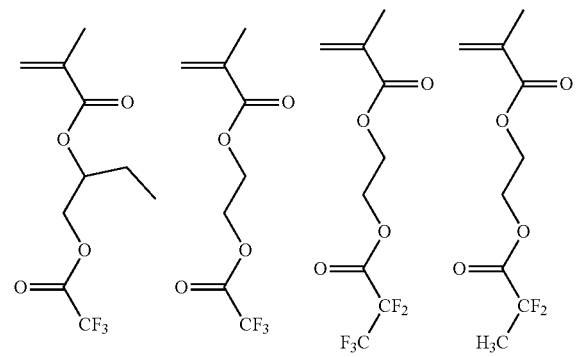

The base-labile polymer may include a repeating unit including two or more base-labile groups. For example, the base-labile polymer can include a repeating unit derived from one or more monomers of Formula (15B):

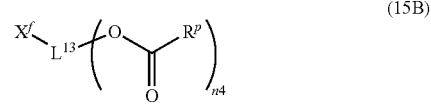

wherein $X^f$ and $R^p$ are as defined in Formula (15A) for $X^e$ and $R^a$, respectively; $L^{13}$ is a polyvalent linking group including one or more of substituted or unsubstituted $C_{1-20}$ alkylene, substituted or unsubstituted $C_{3-20}$ cycloalkylene, —C(O)—, or —C(O)O—; and n4 may be an integer of 2 or greater, for example 2 or 3.

Exemplary monomers of Formula (15B) include the following:

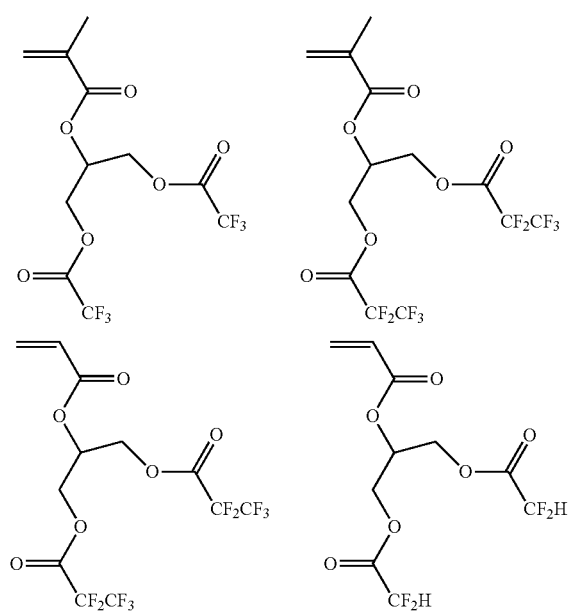

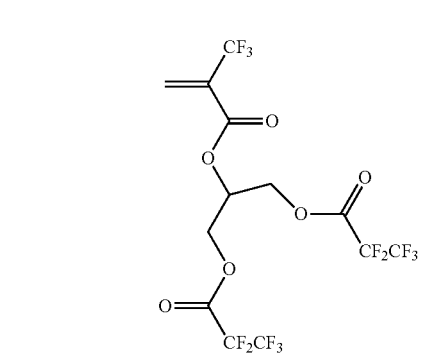

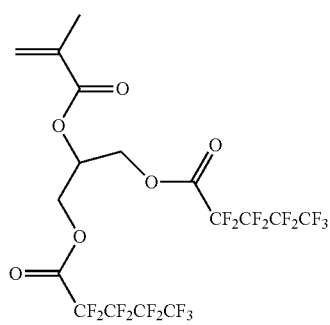

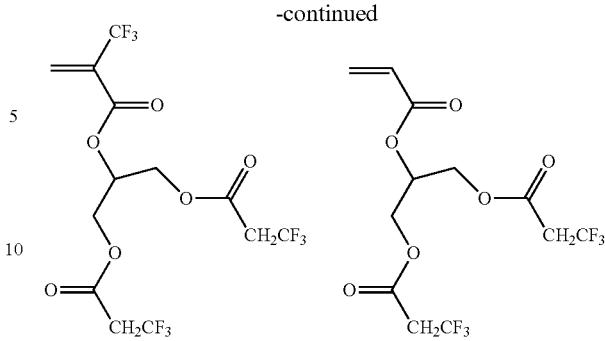

The base-labile polymer may include a repeating unit including one or more base-labile groups. For example, the base-labile polymer can include a repeating unit derived from one or more monomers of Formula (15C):

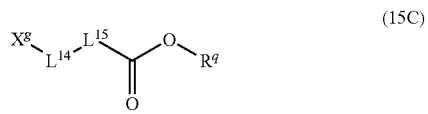

(15C)

wherein $X^g$ and $R^q$ are as defined in Formula (15A) for $X^e$ and $R^a$, respectively; $L^{14}$ is a divalent linking group; and $L^{15}$ is substituted or unsubstituted $C_{1-20}$ fluoroalkylene wherein the carbon atom bonded to the carbonyl (C=O) in Formula (15C) is substituted with at least one fluorine atom.

Exemplary monomers of Formula (15C) include the following:

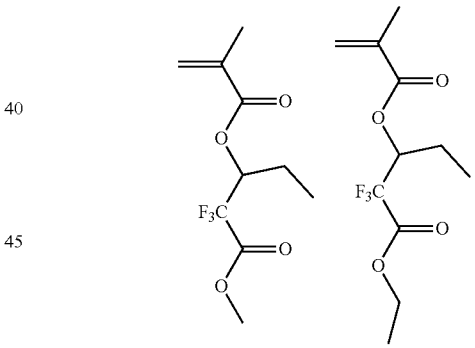

In some embodiments, a base-labile polymer may comprise one or more base-labile groups and one or more acid-labile groups, such as one or more acid-labile ester moieties (e.g., t-butyl ester) or acid-labile acetal groups. For example, the base-labile polymer may comprise a repeating unit including a base-labile group and an acid-labile group, i.e., wherein both a base-labile group and an acid-labile group are present on the same repeating unit. In another example, the base-labile polymer may comprise a first repeating unit comprising a base-labile group and a second repeating unit comprising an acid-labile group. Preferred photoresists of the invention can exhibit reduced defects associated with a resist relief image formed from the photoresist composition.

The base-labile polymer may be prepared using any suitable methods in the art, including those described herein for the first and second polymers. For example, the base-labile polymer may be obtained by polymerization of the respective monomers under any suitable conditions, such as by heating at an effective temperature, irradiation with actinic radiation at an effective wavelength, or a combination thereof. Additionally, or alternatively, one or more base-labile groups may be grafted onto the backbone of a polymer using suitable methods.

In some aspects, the base-labile material is a single molecule comprising one more base-labile ester groups, preferably one or more fluorinated ester groups. The base-labile materials that are single molecules typically have a $M_W$ in the range from 50 to 1,500 Da. Exemplary base-labile materials include the following:

polynorbornenes, polyacetals, polyethylene glycols, polyamides, polyacrylamides, polyphenols, novolacs, styrenic polymers, polyvinyl alcohols, or combinations thereof.

The photoresist composition may further include one or more additional, optional additives. For example, optional additives may include actinic and contrast dyes, anti-striation agents, plasticizers, speed enhancers, sensitizers, photo-decomposable quenchers (PDQ) (and, also known as photo-decomposable bases), basic quenchers, thermal acid generators, surfactants, and the like, or combinations thereof. If present, the optional additives are typically pres-

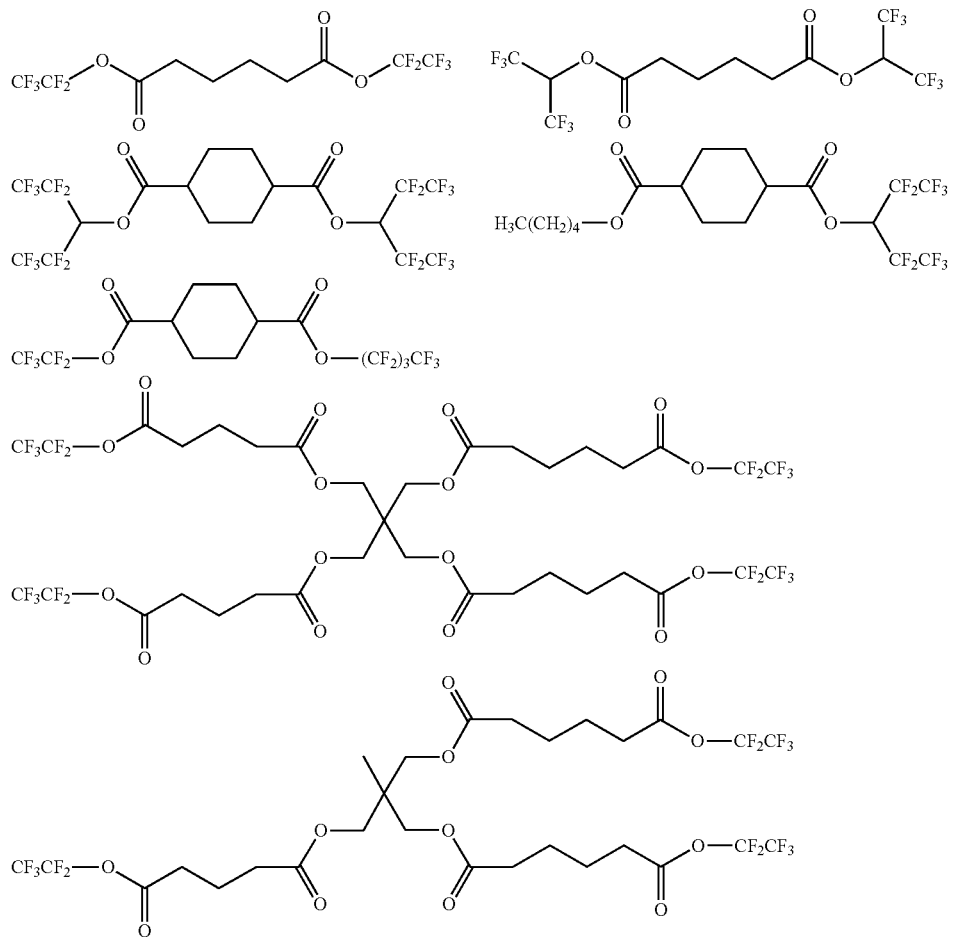

When present, the optional base-labile material is typically present in the photoresist compositions in an amount of from 0.01 to 10 wt %, more typically 1 to 5 wt %, based on total solids of the photoresist composition.

Additionally, or alternatively, to the base-labile polymer, the photoresist compositions may further include one or more polymers in addition to and different from the photoresist polymer described above. For example, the photoresist compositions may include an additional polymer as described above but different in composition, or a polymer that is similar to those described above but does not include each of the requisite repeating units. Additionally, or alternatively, the one or more additional polymers may include those well known in the photoresist art, for example, those chosen from polyacrylates, polyvinylethers, polyesters, ent in the photoresist compositions in an amount of from 0.01 to 10 wt %, based on total solids of the photoresist composition.

PDQs generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds, paired with an anion of a weak acid (pKa>1) such as, for example, an anion of a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary sulfonic acids include p-toluene sulfonic acid, camphor sulfonic acid and the like. In some embodiments, the photo-decomposable quencher is a photo-decomposable organic zwitterion compound such as diphenyliodonium-2-carboxylate.

The photo-decomposable quencher may be in non-polymeric or polymer-bound form. When in polymeric form, the photo-decomposable quencher is present in polymerized units on the first polymer or second polymer. The polymerized units containing the photo-decomposable quencher are typically present in an amount from 0.1 to 30 mole %, preferably from 1 to 10 mole % and more preferably from 1 to 2 mole %, based on total repeating units of the polymer.

Exemplary basic quenchers include, for example: linear aliphatic amines such as tributylamine, trioctylamine, triisopropanolamine, tetrakis(2-hydroxypropyl)ethylenediamine: n-tert-butyldiethanolamine, tris(2-acetoxy-ethyl) amine, 2,2',2'',2'''-(ethane-1,2-diylbis(azanetriyl))tetraethanol, 2-(dibutylamino)ethanol, and 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl)morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; imines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

The basic quenchers may be in non-polymeric or polymer-bound form. When in polymeric form, the quencher may be present in repeating units of the polymer. The repeating units containing the quencher are typically present in an amount of from 0.1 to 30 mol %, preferably from 1 to 10 mol % and more preferably from 1 to 2 mol %, based on total repeating units of the polymer.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants (Omnova). In an aspect, the photoresist composition further includes a surfactant polymer including a fluorine-containing repeating unit.

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Imaging (Marlborough, Massachusetts).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, 1,000 to 2,500 rpm, for a period from 15 to 120 seconds to obtain a layer of the photoresist composition on the substrate. It will be appreciated by those skilled in the art that the thickness of the coated layer may be adjusted by changing the spin speed and/or the total solids of the composition. A photoresist layer formed from the compositions of the invention typically has a dried layer thickness from 10 to 500 nanometers (nm), preferably from 15 to 200 nm, and more preferably from 20 to 120 nm.

The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the photoresist composition and thickness. The soft bake temperature is typically from 80 to 170° C., and more typically from 90 to 150° C. The soft bake time is typically from 10 seconds to 20 minutes, more typically from 1 minute to 10 minutes, and still more typically from 1 minute to 2 minutes. The heating time can be readily determined by one of ordinary skill in the art based on the ingredients of the composition.

The photoresist layer is next pattern-wise exposed to activating radiation to create a difference in solubility between exposed and unexposed regions. Reference herein to exposing a photoresist composition to radiation that is activating for the composition indicates that the radiation can form a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nm, sub-300 nm or sub-200 nm, with 248 nm (KrF), 193 nm (ArF), 13.5 nm (EUV) wavelengths or e-beam lithography being preferred. Preferably, the activating radiation is 193 nm radiation or EUV radiation. The methods find use in immersion or dry (non-immersion) lithography techniques. The exposure energy is typically from 1 to 200 millijoules per square centimeter (mJ/cm$^2$), preferably from 10 to 100 mJ/cm$^2$ and more preferably from 20 to 50 mJ/cm$^2$, dependent upon the exposure tool and components of the photoresist composition.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the photoresist composition and layer thickness. The PEB is typically conducted at a temperature from 70 to 150° C., preferably from 75 to 120° C., and a time from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as tetramethylammonium hydroxide (TMAH), preferably 0.26 N TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof, and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching. The photoresist pattern may, for example, be used for pattern transfer to an underlying hardmask layer which, in turn, is used as an etch mask for pattern transfer to one or more layers below the hardmask layer. If the photoresist pattern is not consumed during pattern transfer, it may be removed from the substrate by known techniques, for example, oxygen plasma ashing. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The invention is further illustrated by the following examples.

EXAMPLES

Synthesis Examples. The synthetic reactions were performed under normal atmospheric conditions. All chemicals were used as received from the suppliers and used without further purification.

Polymer Synthesis. The monomers M1 to M9 that were used to prepare the inventive and comparative polymers have the following structures:

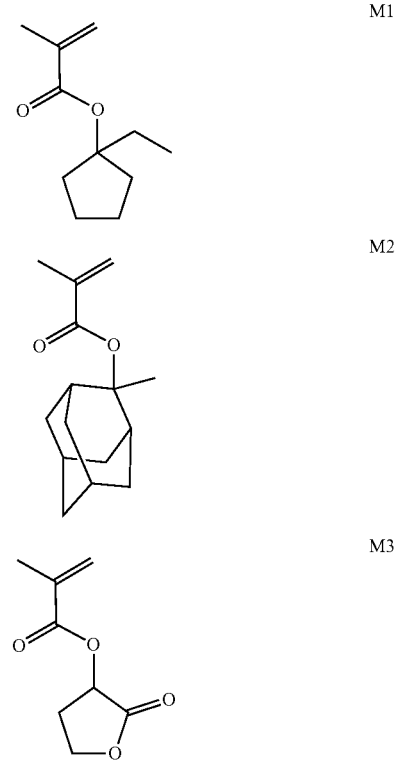

M4
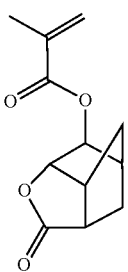

M5
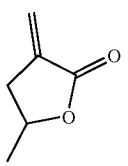

M6
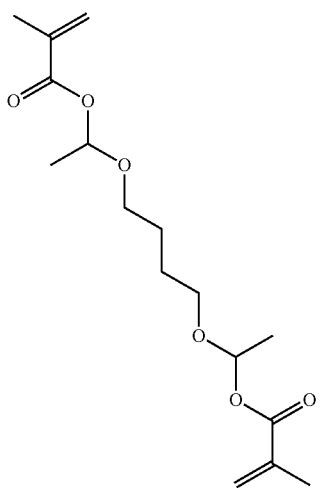

M7
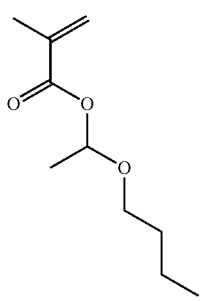

M8
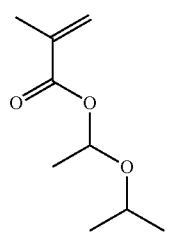

M9
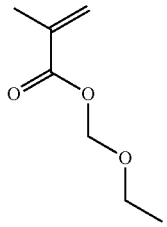

Synthesis of Polymer P1. A monomer solution was prepared by combining 48.98 grams (g) of propylene glycol monomethyl ether acetate (PGMEA), 6.46 g of monomer M1, 8.04 g of monomer M3, 3.94 g of monomer M4, 1.86 g of monomer M6, and 2.20 g of monomer M7 in a flask and agitating the resulting mixture to dissolve the components. Separately, an initiator solution was prepared by combining 6.95 g of PGMEA and 2.19 g of initiator (TRIGONOX 125-C75, Nouryon) in a flask. 19.38 g of PGMEA was introduced into a reaction vessel and the vessel was purged with nitrogen for 30 minutes. The reaction vessel was next heated to 75° C. with agitation. The monomer solution and initiator solutions were then introduced as separate feeds into the reaction vessel over a period of 3 hours. Upon completion of the 4 hours, the reaction vessel was maintained at 75° C. for an additional 30 minutes with agitation and was then allowed to cool to room temperature. The polymer was precipitated by dropwise addition of the reaction mixture into methanol, collected by filtration, and dried in vacuo. Polymer P1 was obtained as a white solid powder.

Synthesis of Polymers P2-P12 and P15-P16. Polymers P2-P12 and P15-P16 were prepared using a procedure similar to that used for the synthesis of Polymer P1, except the monomers, amounts (expressed in mol %), and properties are as provided in Table 1.

Synthesis of Polymer P13. A monomer solution was prepared by combining 32.95 g of PGMEA, 11.80 g of monomer M1, 11.01 g of monomer M3, and 7.19 g of monomer M4 in a flask and agitating the mixture to dissolve the components. Separately, an initiator feed was prepared by combining 16.71 g of PGMEA and 1.86 g of initiator (V601, Wako Chemical) in a flask. 21.00 g of PGMEA was introduced into a reaction vessel and the vessel was purged with nitrogen for 30 minutes. The reaction vessel was next heated to 80° C. with agitation. The monomer solution and initiator solution were then introduced into the reaction vessel and fed over a period of 4 hours. After the addition was completed, the reaction vessel was maintained at 80° C. for an additional one hour with agitation and was then allowed to cool to room temperature. The polymer was precipitated by dropwise addition of the reaction mixture into methanol, collected by filtration, and dried in vacuo. Polymer P13 was obtained as a white powdery solid.

Synthesis of Polymers P14 and P17-P18. Polymers P14 and P17-P18 were prepared using a procedure similar to that used for the synthesis of Polymer P13, except the monomers and (expressed in mol %), and properties are as provided in Table 1.

TABLE 1

| Polymer | M1 | M2 | M3 | M4 | M5 | M6 | M7 | M8 | M9 | $M_w/M_n$ (kDa) |
|---|---|---|---|---|---|---|---|---|---|---|
| P1 | 30 |  | 40 | 15 |  | 5 | 10 |  |  | 9.65/5.05 |
| P2 | 30 |  | 40 | 15 |  | 10 | 5 |  |  | 11.51/5.90 |

TABLE 1-continued

| Polymer | M1 | M2 | M3 | M4 | M5 | M6 | M7 | M8 | M9 | $M_w/M_n$ (kDa) |
|---|---|---|---|---|---|---|---|---|---|---|
| P3 | 30 | | 40 | 15 | | 5 | | 10 | | 13.83/5.37 |
| P4 | 30 | | 40 | | 15 | 5 | | 10 | | 10.55/5.04 |
| P5 | | 30 | 40 | | 15 | 5 | 10 | | | 9.03/4.28 |
| P6 | 30 | | 40 | | 15 | 5 | 10 | | | 11.5/5.89 |
| P7 | 30 | | 40 | 15 | | 5 | | | 10 | 11.43/4.99 |
| P8 | 30 | | 40 | | 15 | 5 | | | 10 | 8.9/4.72 |
| P9 | 30 | | 30 | | 25 | 5 | 10 | | | 9.2/5.03 |
| P10 | 30 | | 30 | 25 | | 5 | 10 | | | 9.52/4.97 |
| P11 | | | 40 | 20 | | 5 | 35 | | | 9.21/4.76 |
| P12 | | | 40 | | 20 | 5 | 35 | | | 9.55/5.52 |
| P13[a] | 40 | | 40 | 20 | | | | | | 7.59/4.09 |
| P14[a] | 30 | | 40 | 20 | | | | 10 | | 7.62/3.56 |
| P15[a] | 30 | | 40 | 20 | | 10 | | | | 9.45/4.53 |
| P16[a] | 30 | | 40 | | 20 | 10 | | | | 12.5/5.02 |
| P17[a] | 30 | | 40 | | 20 | | 10 | | | 7.49/5.18 |
| P18[a] | | | 40 | 20 | | | 40 | | | 9.98/5.43 |

[a]indicates a comparative polymer

Synthesis of E1. A monomer solution was prepared by combining 192.00 g GMEA, 133.2 g of (methacryloyloxy) methylene bis(2,2-difluoro-3,3-dimethylbutanoate), and 8.51 g of ethylcyclopentyl methacrylate in a flask and agitating the resulting mixture to dissolve the components. Separately, an initiator solution was prepared by combining 10.72 g of PGMEA and 6.2 g of V601 initiator (Wako Chemical) in a flask. 20.05 g of PGMEA was introduced into a separate reaction vessel and the vessel was purged with nitrogen for 30 minutes. The reaction vessel was next heated to 95° C. with agitation. The monomer solution and initiator solutions were then introduced as separate feeds into the reaction vessel over a period of 2.5 hours. Upon completion of the 2.5 hours, the reaction vessel was maintained at 95° C. for additional 3 hours with agitation and was then allowed to cool to room temperature. Polymer E1 was obtained with a $M_w/M_n$ (kDa) 9.658/6.192.

Additive polymer E1 has the following structure:

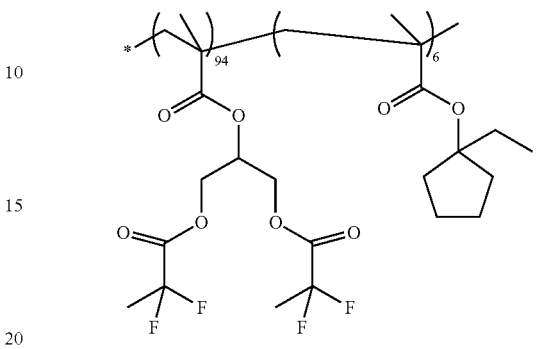

Photoresist Formulations. Photoresist compositions were prepared from the polymers described in Table 1 by dissolving solid components in solvents using the materials and amounts set forth for the inventive and comparative photoresist compositions in Tables 2 and 3. Each mixture was filtered through a PTFE disk-shaped filter having a pore size of 0.2 m. The amounts of the polymer, PAG, quencher, and base-labile polymer are reported as wt % based on the total weight of the photoresist composition. The solvents were PGMEA (S1), HBM (S2), and GBL (S3).

TABLE 2

| Composition Photoresist | Polymer | PAG | Quencher | Base-labile polymer | S1 | S2 | S3 |
|---|---|---|---|---|---|---|---|
| PR1 | P1 (2.27%) | B1 (0.532%) | C1 (0.108%) | E1 (0.090%) | 33.9% | 63.1% | |
| PR2 | P1 (2.54%) | B5 (0.31%) | C2 (0.155%) | E1 (0.093%) | 33.915% | 62.985% | |
| PR3 | P2 (2.27%) | B1 (0.532%) | C1 (0.108%) | E1 (0.090%) | 33.9% | 63.1% | |
| PR4 | P3 (2.27%) | B1 (0.532%) | C1 (0.108%) | E1 (0.090%) | 33.9% | 63.1% | |
| PR5 | P4 (2.27%) | B1 (0.532%) | C1 (0.108%) | E1 (0.090%) | 33.9% | 63.1% | |
| PR6 | P4 (2.54%) | B5 (0.310%) | C2 (0.155%) | E1 (0.093%) | 33.915% | 62.985% | |
| PR7 | P5 (2.27%) | B1 (0.532%) | C1 (0.108%) | E1 (0.090%) | 33.9% | 63.1% | |
| PR8 | P6 (2.27%) | B1 (0.532%) | C1 (0.108%) | E1 (0.090%) | 33.9% | 63.1% | |
| PR9 | P7 (2.27%) | B1 (0.532%) | C1 (0.108%) | E1 (0.090%) | 33.9% | 63.1% | |
| PR10 | P8 (2.27%) | B1 (0.532%) | C1 (0.108%) | E1 (0.090%) | 33.9% | 63.1% | |
| PR11 | P9 (2.27%) | B1 (0.532%) | C1 (0.108%) | E1 (0.090%) | 33.9% | 63.1% | |
| PR12 | P10 (2.27%) | B1 (0.532%) | C1 (0.108%) | E1 (0.090%) | 33.9% | 63.1% | |
| PR13[a] | P13 (2.27%) | B1 (0.532%) | C1 (0.108%) | E1 (0.090%) | 33.9% | 63.1% | |
| PR14[a] | P14 (2.27%) | B1 (0.532%) | C1 (0.108%) | E1 (0.090%) | 33.9% | 63.1% | |
| PR15[a] | P15 (2.27%) | B1 (0.532%) | C1 (0.108%) | E1 (0.090%) | 33.9% | 63.1% | |
| PR16 | P1 (2.67%) | B2 (0.539%) | C1 (0.102%) | E1 (0.099%) | 28.04% | 62.86% | 5.8% |
| PR17[a] | P14 (2.67%) | B2 (0.539%) | C1 (0.102%) | E1 (0.099%) | 28.04% | 62.86% | 5.8% |
| PR18[a] | P15 (2.67%) | B2 (0.539%) | C1 (0.102%) | E1 (0.099%) | 28.04% | 62.86% | 5.8% |

[a]indicates a comparative photoresist composition

TABLE 3

| Photoresist Composition | Polymer | PAG | Quencher | Base-labile Polymer | S1 | S2 | S3 |
|---|---|---|---|---|---|---|---|
| PR19 | P6 (2.44%) | B2 (0.432%) B3 (0.154%) | C1 (0.080%) | E1 (0.096%) | 28.07% | 62.92% | 5.81% |
| PR20 | P1 (2.44%) | B2 (0.432%) B3 (0.154%) | C1 (0.080%) | E1 (0.096%) | 28.07% | 62.92% | 5.81% |
| PR21[a] | P16 (0.85%) P17 (1.586%) | B2 (0.432%) B3 (0.144%) | C1 (0.075%) | E1 (0.09%) | 28.07% | 62.92% | 5.81% |
| PR22[a] | P15 (0.85%) P14 (1.586%) | B2 (0.432%) B3 (0.144%) | C1 (0.075%) | E1 (0.09%) | 28.07% | 62.92% | 5.81% |
| PR23 | P1 (2.44%) | B1 (0.426%) B3 (0.154%) | C1 (0.080%) | E1 (0.096%) | 28.07% | 62.92% | 5.81% |

TABLE 3-continued

| Photoresist Composition | Polymer | PAG | Quencher | Base-labile Polymer | S1 | S2 | S3 |
|---|---|---|---|---|---|---|---|
| PR24 | P6 (2.44%) | B1 (0.426%) B3 (0.154%) | C1 (0.080%) | E1 (0.096%) | 28.07% | 62.92% | 5.81% |
| PR25 | P2 (2.44%) | B1 (0.426%) B3 (0.154%) | C1 (0.080%) | E1 (0.096%) | 28.07% | 62.92% | 5.81% |
| PR26[a] | P15 (2.44%) | B1 (0.426%) B3 (0.154%) | C1 (0.080%) | E1 (0.096%) | 28.07% | 62.92% | 5.81% |
| PR27 | P1 (2.44%) | B2 (0.432%) B4 (0.154%) | C1 (0.080%) | E1 (0.096%) | 28.07% | 62.92% | 5.81% |
| PR28[a] | P15 (2.44%) | B2 (0.432%) B4 (0.154%) | C1 (0.080%) | E1 (0.096%) | 28.07% | 62.92% | 5.81% |
| PR29[a] | P14 (2.44%) | B2 (0.432%) B4 (0.154%) | C1 (0.080%) | E1 (0.096%) | 28.07% | 62.92% | 5.81% |
| PR30 | P11 (2.53%) | B6 (0.384%) | C1 (0.093%) | E1 (0.093%) | 33.915% | 62.985% | |
| PR31 | P12 (2.53%) | B6 (0.384%) | C1 (0.093%) | E1 (0.093%) | 33.915% | 62.985% | |
| PR32[a] | P18 (2.52%) | B6 (0.384%) | C1 (0.099%) | E1 (0.093%) | 33.915% | 62.985% | |
| PR33 | P1 (2.457%) | B1 (0.55%) | C1 (0.093%) | E2 (0.093%) | 33.91% | 62.985% | |
| PR34[a] | P14 (2.457%) | B1 (0.55%) | C1 (0.093%) | E2 (0.093%) | 33.91% | 62.985% | |

[a]indicates a comparative photoresist composition

Photoresist Components. The structures of the PAG compounds B1 to B6 were as follows:

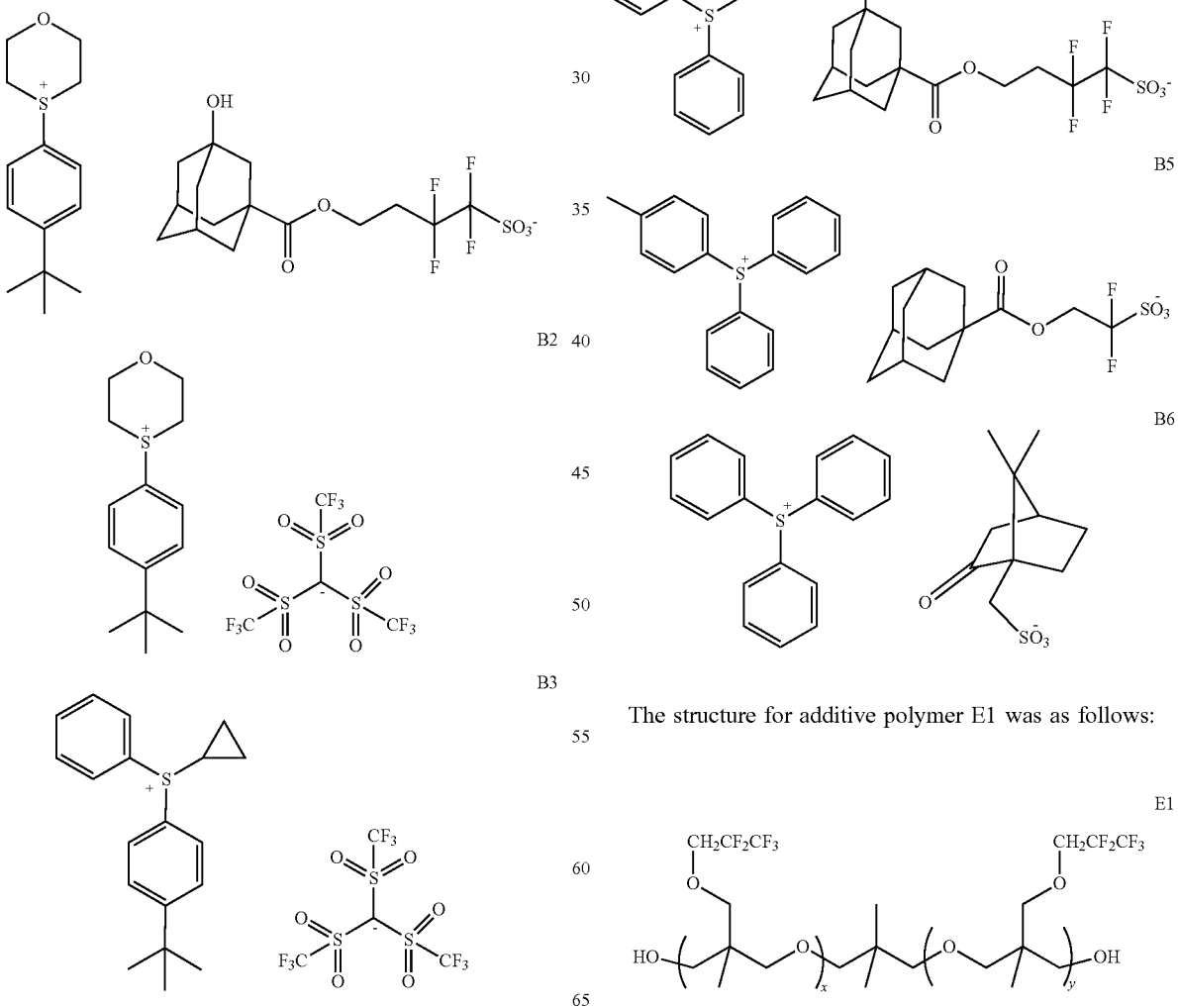

The structure for additive polymer E1 was as follows:

The structures for C1 and C2 were as follows:

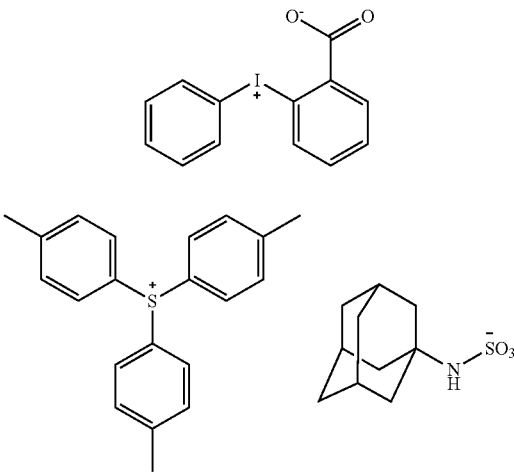

Lithographic Evaluation. Immersion lithography was performed with a TEL Lithius 300 mm wafer track and ASML 1900i immersion scanner at 1.35 NA, 0.90/0.988 inner/outer sigma, and dipole illumination with 35Y polarization. Wafers for photolithographic testing were coated with an AR40A bottom antireflective coating (BARC) (DuPont Electronics & Imaging) and cured at 205° C. for 60 seconds to give a first BARC underlayer having a thickness of 800 Å. A coating of AR104 BARC (DuPont Electronics & Imaging) was then disposed on the first BARC underlayer and cured at 175° C. for 60 seconds to form a second BARC underlayer having a thickness of 400 Å.

Each of the respective photoresist compositions PR1 to PR34 was spin-coated onto a wafter that had been coated with the first and second BARC underlayers, and the resulting uncured stack was then soft-baked at 110° C. for 60 seconds to provide a photoresist film layer having a thickness of 900 Å. The wafers were exposed using a mask having 1:1, 1:1.1 line-space (L/S) patterns (38 nm linewidth/76 nm pitch, 37 nm linewidth/74 nm pitch, 34 nm linewidth/74 nm pitch). The exposed wafers were heated (PEB) at 95° C. for 60 seconds, developed with a 0.26 N TMAH solution for 12 seconds, and then rinsed with deionized water and spin dried.

CD linewidth measurements of the formed patterns were made using a Hitachi CG4000 CD-SEM. Three exposure latitudes were taken for each wafer and averaged. The averaged exposure latitude was then fit using a polynomial regression to determine the correct sizing dose ($E_{size}$). The value of $E_{size}$ (millijoules per square centimeter, mJ/cm²) was evaluated based on the exposure dose at which the pattern CD is equal to the CD of the mask pattern (38 nm linewidth). Line width roughness (LWR) for the patterns were determined by processing the image captured by top-down SEM. LWR was calculated from the deviation in the width of a line measured over a given length using a 3-sigma (3σ) deviation of the line width from the distribution of a total of 100 arbitrary line width measurements. Pattern collapse margin (PCM) represents the smallest critical dimension before the pattern fails by line collapse or line erosion. Exposure latitude (EL, %) was calculated according to Equation 1:

$$EL\% = [(1/m) * 2 * 10\% * (\text{Target CD}/E_{size})] \times 100\% \quad \text{Equation 1}$$

Table 4 shows the lithographic results for Examples 1-15.

TABLE 4

| Example | Photoresist Composition | LWR (38 nm) | LWR (37 nm) | LWR (34 nm) |
|---|---|---|---|---|
| 1 | PR1 | 2.20 | 3.30 | 3.60 |
| 2 | PR2 | 2.6 | 4.3 | 5.0 |
| 3 | PR3 | 2.43 | 3.67 | 4.10 |
| 4 | PR4 | 2.55 | 3.73 | 3.82 |
| 5 | PR5 | 2.42 | 3.59 | 3.53 |
| 6 | PR6 | 2.7 | 4.4 | 4.3 |
| 7 | PR7 | 2.79 | 3.75 | 4.11 |
| 8 | PR8 | 2.20 | 3.35 | 3.55 |
| 9 | PR9 | 2.45 | 3.34 | 4.2 |
| 10 | PR10 | 2.38 | 3.32 | 4.18 |
| 11 | PR11 | 2.32 | 3.33 | 4.12 |
| 12 | PR12 | 2.36 | 3.35 | 4.15 |
| 13* | PR13 | 2.5 | 3.57 | 4.2 |
| 14* | PR14 | 2.53 | 3.82 | 4.36 |
| 15* | PR15 | 2.50 | 3.80 | 3.90 |

*indicates a Comparative Example

As shown in Table 4, the combination of monomer M6 and one of monomers M7, M8, or M9 provided polymers for photoresist compositions having improved LWR compared to the polymers prepared from either one of monomer M6 or one of monomers M7, M8, or M9 (i.e., without the inventive combination of monomers).

Table 5 shows the lithographic results for Examples 16-22.

TABLE 5

| Example | Photoresist Composition | $E_{size}$ (mJ) | LWR (38 nm) | LWR (34 nm) | EL% (38 nm) | PCM (38 nm) |
|---|---|---|---|---|---|---|
| 16 | PR16 | 24.07 | 2.30 | 3.53 | 12.1% | 24 |
| 17* | PR17 | n/a | n/a | 3.97 | n/a | n/a |
| 18* | PR18 | 21.75 | 2.50 | 3.81 | 10.6% | 25.7 |
| 19 | PR19 | 17.8 | 2.58 | 4.03 | 12.8% | 24.5 |
| 20 | PR20 | 17.5 | 2.46 | 3.98 | 12.6% | 24.7 |
| 21* | PR21 | 19 | 2.62 | 4.12 | 12.2% | 26.5 |
| 22* | PR22 | 19.9 | 2.61 | 4.26 | 11.6% | 27.7 |

*indicates a Comparative Example

As shown in Table 5, the photoresist compositions PR16 and PR20 that each included polymer P1 (5 mol % o of M6, 10 mol % o of M7) of Examples 16 and 20 both achieved improved lithographic performance compared to Example 17 that included the photoresist composition PR17 (polymer P14, 10 mol % o of M7 only), Example 18 that included the photoresist composition PR18 (polymer P15, 10 mol % o of M6 only), Example 21 that included PR21 (blend of polymers P16 (10 mol % o of M6 only) and P17 (10 mol % o of M7 only)), and Example 22 that included PR22 (blend of polymers P14 (10 mol % o of M7 only) and P15 (10 mol % of M6 only). The results show the inventive polymers provided photoresist compositions that achieved improved LWR, exposure latitude, pattern collapse margin, and photospeed.

Table 6 shows the lithographic results for Examples 23-26.

TABLE 6

| Example | Photoresist Composition | $E_{size}$ (mJ) | LWR (38 nm) | EL % (38 nm) |
|---|---|---|---|---|
| 23 | PR23 | 2.34 | 18.52 | 12.0% |
| 24 | PR24 | 2.34 | 18.97 | 12.5% |

TABLE 6-continued

| Example | Photoresist Composition | $E_{size}$ (mJ) | LWR (38 nm) | EL % (38 nm) |
|---|---|---|---|---|
| 25 | PR25 | 2.39 | 19.70 | 10.0% |
| 26* | PR26 | 2.46 | 19.42 | 8.7% |

*indicates a Comparative Example

As shown in Table 6, the photoresist compositions PR23, PR24, and PR25 that included polymer P1 (5 mol % of M6, 10 mol % of M7), polymer P6 (5 mol % of M6, 10 mol % of M7), and polymer P2 (10 mol % of M6, 5 mol % of M7) of Examples 23-25, respectively, achieved improved lithographic performance compared to Example 26 that included the photoresist composition PR26 (polymer P15, 10 mol % of M6 only). The results show the inventive polymers provided photoresist compositions that achieved improved LWR, exposure latitude, and photospeed.

Table 7 shows the lithographic results for Examples 27-29.

TABLE 7

| Example | Photoresist Composition | LWR (38 nm) | PCM (38 nm) | LWR (34 nm) |
|---|---|---|---|---|
| 27 | PR27 | 2.37 | 25.2 | 3.67 |
| 28* | PR28 | 2.52 | 27.8 | 3.94 |
| 29* | PR29 | 2.39 | 27.4 | 4.01 |

*indicates a Comparative Example

As shown in Table 7, the photoresist composition PR27 that included polymer P1 (5 mol % of M6, 10 mol % of M7) of Example 27 achieved improved lithographic performance compared to Examples 28-29 that included the photoresist composition PR28 (polymer P15, 10 mol % of M6 only) or PR29 (polymer P14, 10 mol % M7 only). The results show the inventive polymer provided a photoresist composition that achieve improved LWR, pattern collapse margin, and photospeed.

Table 8 shows the lithographic results for Examples 30-32.

TABLE 8

| Example | Photoresist Composition | $E_{size}$ (mJ) | LWR (38 nm) |
|---|---|---|---|
| 30 | PR30 | 21 | 2.8 |
| 31 | PR31 | 14 | 3.3 |
| 32 | PR32 | n/a | n/a |

*indicates a Comparative Example

As shown in Table 8, the photoresist compositions PR30 that included polymer P11 (5 mol % of M6, 35 mol % of M7) of Example 30 and PR31 that included polymer P12 (5 mol % of M6, 35 mol % of M7) of Example 31 both achieved improved lithographic performance compared to Example 32 that included the photoresist composition PR32 (polymer P18, 40 mol % of M7 only). The results show the inventive polymers provided photoresist compositions that achieved improved LWR and photospeed.

193 nm Dry Etch Evaluation. Examples 33-34 were evaluated at 193 nm using a dry etch method. The wafers were exposed using an ASML 1100 immersion scanner (0.75 NA, 0.89/0.64 inner/outer sigma, dipole illumination with 35Y polarization) using a mask having 1:1 line-space pattern (75 nm linewidth/150 nm pitch). The exposed wafers were heated (PEB) at 95° C. for 60 seconds, developed with a 0.26 N TMAH solution for 12 seconds, and then rinsed with deionized water and spin dried. CD linewidth measurements of the formed patterns were made using a Hitachi CG4000 CD-SEM. The value of $E_{size}$ (mJ) were evaluated based on the exposure dose at which the pattern CD is equal to the CD of the mask pattern (75 nm linewidth). LWR was determined as described above for Examples 1-15.

Table 9 shows the lithographic results for Examples 33-34.

TABLE 9

| Example | Photoresist Composition | $E_{size}$ (mJ) | LWR (75 nm) |
|---|---|---|---|
| 33 | PR33 | 21 | 2.8 |
| 34* | PR34 | 14 | 3.3 |

*indicates a Comparative Example

As shown in Table 9, the photoresist composition PR33 that included polymer P1 (5 mol % of M6, 10 mol % of M7) of Example 33 achieved improved lithographic performance at 75 nm linewidth compared to Example 34 that included the photoresist composition PR34 (polymer P14, 10 mol % of M7 only). The results show the inventive polymer provided a photoresist composition that achieved improved LWR and photospeed.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A polymer, comprising:
    a first repeating unit derived from a first monomer comprising a single ester acetal group;
    a second repeating unit derived from a second monomer comprising a plurality of ester acetal groups; and
    a repeating unit comprising a lactone group, wherein the repeating unit comprising the lactone group is structurally different from the first repeating unit and the second repeating unit,
    wherein the second monomer is of Formula (5):

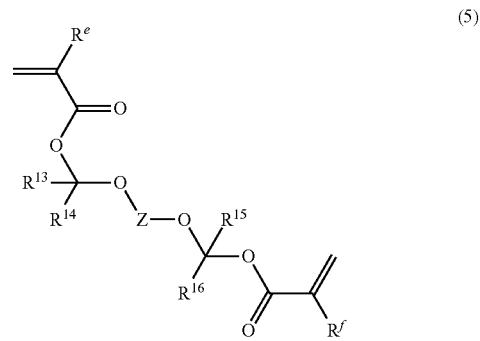

wherein, in Formula (5),
    $R^e$ and $R^f$ are each independently hydrogen, fluorine, cyano, or substituted or unsubstituted $C_{1-10}$ alkyl;
    $R^{13}$, $R^{14}$, $R^{15}$, and $R^{16}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{3-20}$ heteroaryl, substituted or unsubstituted $C_{4-30}$ heteroarylalkyl, or substituted or unsubstituted $C_{4-30}$ alkylheteroaryl;
at least one of $R^{13}$, $R^{14}$, $R^{15}$, or $R^{16}$ is not hydrogen;
$R^{13}$ and $R^{14}$ optionally together form a ring via a single bond or a divalent linking group;
$R^{15}$ and $R^{16}$ optionally together form a ring via a single bond or a divalent linking group; and
Z is a divalent linking group.

2. The polymer of claim 1, wherein the first monomer and the second monomer each comprises carbon-carbon unsaturated vinylic group.

3. The polymer of claim 1, wherein the first monomer is of Formula (1):

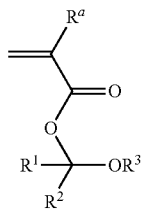

(1)

wherein,
$R^a$ is hydrogen, fluorine, cyano, substituted or unsubstituted $C_{1-10}$ alkyl;
$R^1$ and $R^2$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{3-20}$ heteroaryl, substituted or unsubstituted $C_{4-30}$ heteroarylalkyl, or substituted or unsubstituted $C_{4-30}$ alkylheteroaryl, wherein each of $R^1$ and $R^2$ optionally further comprises a divalent linking group as part of their structure;
$R^1$ and $R^2$ together optionally form a ring via a single bond or a divalent linking group, wherein the ring is substituted or unsubstituted;
$R^3$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein $R^3$ optionally further comprises a divalent linking group as part of its structure; and
one of $R^1$ or $R^2$ optionally forms a ring together with $R^3$ via a single bond or a divalent linking group, wherein the ring is substituted or unsubstituted.

4. The polymer of claim 1, further comprising a third repeating unit comprising an acid labile group, wherein the third repeating unit comprises a tertiary alkyl ester group.

5. The polymer of claim 1, wherein the polymer further comprises a fourth repeating unit comprising a polar group, wherein the polar group is pendant to the backbone of the polymer.

6. A photoresist composition, comprising:
the polymer of claim 1;
a photoacid generator; and
a solvent.

7. The photoresist composition of claim 6, further comprising a photo-decomposable quencher or a basic quencher.

8. A method for forming a pattern, the method comprising:
applying a layer of the photoresist composition of claim 6 on a substrate to provide a photoresist composition layer;
pattern-wise exposing the photoresist composition layer to activating radiation to provide an exposed photoresist composition layer; and
developing the exposed photoresist composition layer to provide a photoresist pattern.

9. The method of claim 8, wherein the photoresist composition layer is exposed to 193 nm radiation or EUV radiation.

10. The photoresist composition of claim 6, wherein the first monomer and the second monomer each comprises carbon-carbon unsaturated vinylic group.

11. The photoresist composition of claim 6, wherein the first monomer is of Formula (1):

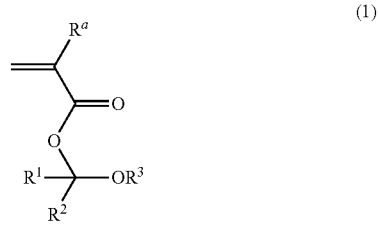

(1)

wherein,
$R^a$ is hydrogen, fluorine, cyano, substituted or unsubstituted $C_{1-10}$ alkyl;
$R^1$ and $R^2$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, substituted or unsubstituted $C_{7-30}$ arylalkyl, substituted or unsubstituted $C_{7-30}$ alkylaryl, substituted or unsubstituted $C_{3-20}$ heteroaryl, substituted or unsubstituted $C_{4-30}$ heteroarylalkyl, or substituted or unsubstituted $C_{4-30}$ alkylheteroaryl, wherein each of $R^1$ and $R^2$ optionally further comprises a divalent linking group as part of their structure;
$R^1$ and $R^2$ together optionally form a ring via a single bond or a divalent linking group, wherein the ring is substituted or unsubstituted;
$R^3$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein $R^3$ optionally further comprises a divalent linking group as part of its structure; and
one of $R^1$ or $R^2$ optionally forms a ring together with $R^3$ via a single bond or a divalent linking group, wherein the ring is substituted or unsubstituted.

12. The photoresist composition of claim 6, further comprising a third repeating unit comprising an acid-labile group, wherein the third repeating unit comprises a tertiary alkyl ester group.

13. The photoresist composition of claim 6, wherein the polymer further comprises a fourth repeating unit comprising a polar group, wherein the polar group is pendant to the backbone of the polymer.

14. The method of claim 8, wherein the first monomer and the second monomer each comprises carbon-carbon unsaturated vinylic group.

15. The method of claim 8, wherein the first monomer is of Formula (1):

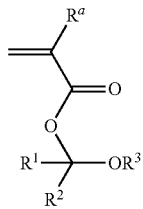

(1)

wherein,
R$^a$ is hydrogen, fluorine, cyano, substituted or unsubstituted C$_{1-10}$ alkyl;
R$^1$ and R$^2$ are each independently hydrogen, substituted or unsubstituted C$_{1-20}$ alkyl, substituted or unsubstituted C$_{3-20}$ cycloalkyl, substituted or unsubstituted C$_{3-20}$ heterocycloalkyl, substituted or unsubstituted C$_{6-20}$ aryl, substituted or unsubstituted C$_{7-30}$ arylalkyl, substituted or unsubstituted C$_{7-30}$ alkylaryl, substituted or unsubstituted C$_{3-20}$ heteroaryl, substituted or unsubstituted C$_{4-30}$ heteroarylalkyl, or substituted or unsubstituted C$_{4-30}$ alkylheteroaryl, wherein each of R$^1$ and R$^2$ optionally further comprises a divalent linking group as part of their structure;
R$^1$ and R$^2$ together optionally form a ring via a single bond or a divalent linking group, wherein the ring is substituted or unsubstituted;
R$^3$ is substituted or unsubstituted C$_{1-20}$ alkyl, substituted or unsubstituted C$_{3-20}$ cycloalkyl, or substituted or unsubstituted C$_{3-20}$ heterocycloalkyl, wherein R$^3$ optionally further comprises a divalent linking group as part of its structure; and
one of R$^1$ or R$^2$ optionally forms a ring together with R$^3$ via a single bond or a divalent linking group, wherein the ring is substituted or unsubstituted.

16. The method of claim 8, further comprising a third repeating unit comprising an acid-labile group, wherein the third repeating unit comprises a tertiary alkyl ester group.

17. The method of claim 8, wherein the polymer further comprises a fourth repeating unit comprising a polar group, wherein the polar group is pendant to the backbone of the polymer.

* * * * *